(12) United States Patent
James et al.

(10) Patent No.: US 6,879,523 B1
(45) Date of Patent: Apr. 12, 2005

(54) RANDOM ACCESS MEMORY (RAM) METHOD OF OPERATION AND DEVICE FOR SEARCH ENGINE SYSTEMS

(75) Inventors: David V. James, Palo Alto, CA (US); Jagadeesan Rajamanickam, San Jose, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 259 days.

(21) Appl. No.: 10/300,361

(22) Filed: Nov. 20, 2002

Related U.S. Application Data

(60) Provisional application No. 60/343,973, filed on Dec. 27, 2001.

(51) Int. Cl.[7] .............................................. G11C 16/04
(52) U.S. Cl. .............................. 365/189.01; 365/189.03
(58) Field of Search ...................... 365/189.01, 189.03

(56) References Cited

U.S. PATENT DOCUMENTS

| | | | |
|---|---|---|---|
| 4,484,275 A | * 11/1984 | Katzman et al. | ............... 710/40 |
| 4,817,091 A | * 3/1989 | Katzman et al. | ................ 714/8 |
| 5,829,007 A | * 10/1998 | Wise et al. | ............ 365/189.04 |
| 5,930,359 A | 7/1999 | Kempke et al. | |
| 6,658,578 B1 | * 12/2003 | Laurenti et al. | ............. 713/324 |
| 6,799,246 B1 | * 9/2004 | Wise et al. | ................. 711/117 |

OTHER PUBLICATIONS

"IEEE Standard for Scalable Coherent Interface (SCI)", *IEEE Std 1596–1992*, Institute of Electrical and Electronic Engineers, Inc., New York, NY, pp. 4–25 and 47–72, May 23, 2001.

* cited by examiner

*Primary Examiner*—Michael S. Lebentritt
*Assistant Examiner*—Tuan T. Nguyen
(74) *Attorney, Agent, or Firm*—Bradley T. Sako

(57) ABSTRACT

A search engine system (100) is disclosed that can include at least one content addressable memory (CAM) device (102) arranged in a cascade configuration with at least one memory device (104), such as a static random access memory (SRAM). A CAM device (102) and memory device (104) may be connected to one another by point-to-point unidirectional connections. Command data issued by a device, such as a network processing unit (NPU) (110), can flow through all devices beginning with a CAM device (102) and eventually to a memory device (104). A memory device (104) can compare its own current result data with that of a previous device in a flow (such as another RAM device), and generate an output response.

8 Claims, 17 Drawing Sheets

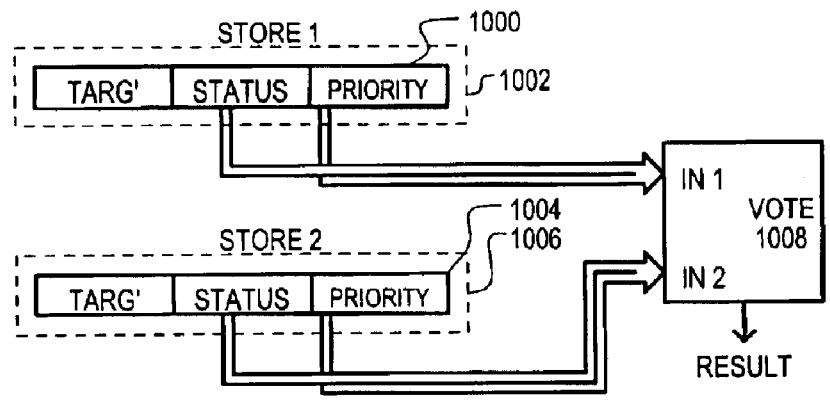
FIG. 10
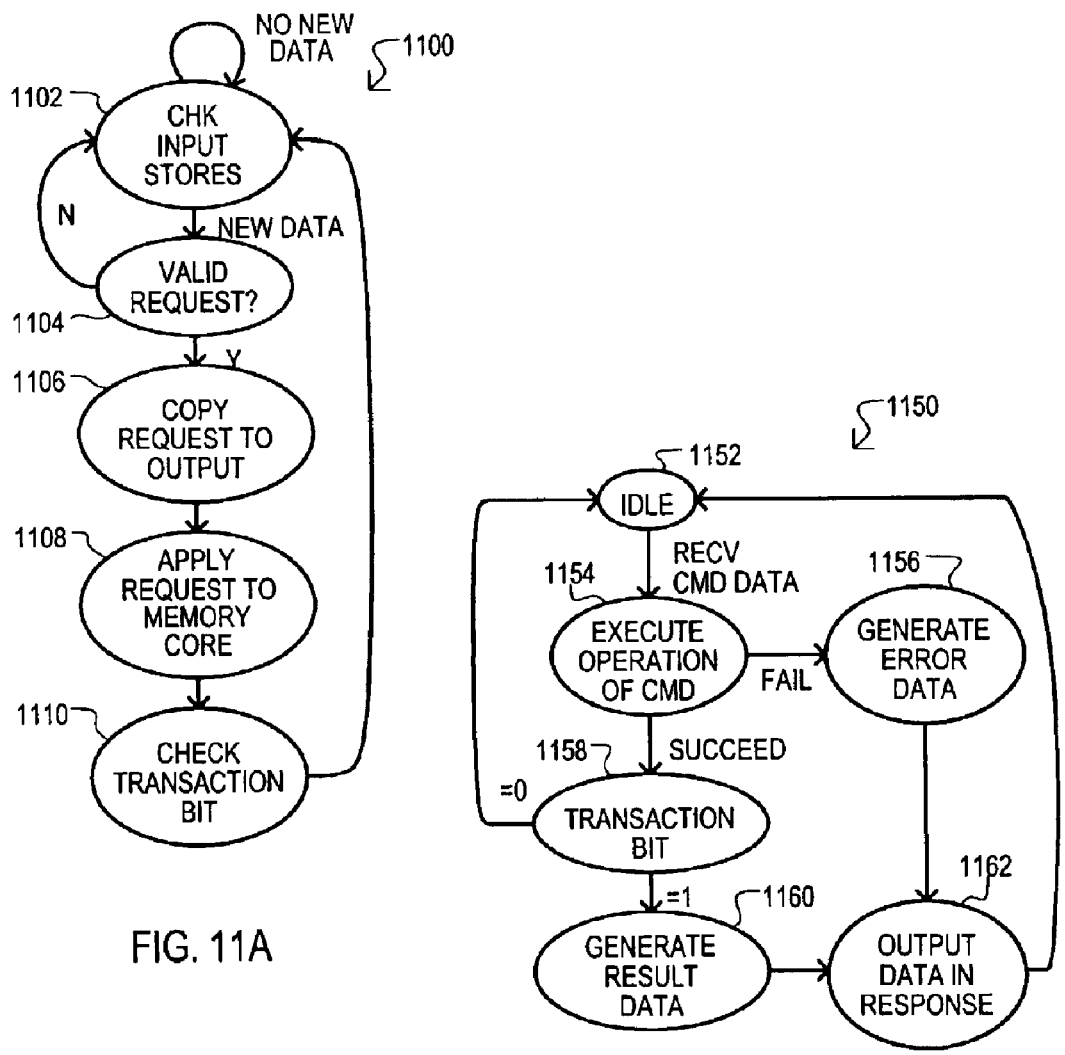
FIG. 11A
FIG. 11B

| F/S | TARG | CMD | DATAa | (CHIP) | ADDRESS |
|---|---|---|---|---|---|
| | | | RANGE DATA | | |

FIG. 12

| F/S | TARG' | STAT | PRIOR | ADDRESS |
|---|---|---|---|---|
| | | | RANGE DATA' | |

FIG. 13

| CMD | | NAME | DESCRIPTION |
|---|---|---|---|
| 0000 | xxxx | — | Reserved |
| 0001 | deee | ReadRange | Read Current Values |
| 0010 | deee | Add4Range | Add 4-byte Values |
| 0011 | deee | Add8Range | Add 8-byte Values |
| 0100 | deee | InsertRange | Conditional Write-if-Zero |
| 0101 | deee | WriteRange | Write Data Values |
| 0110 | deee | SetRange | Set Masked Bits |
| 0111 | deee | ClearRange | Clear Masked Bits |
| 1000 | cccc | Add1Byte | Add to 1-byte Values |
| 1001 | cccc | Add2Byte | Add to 2-byte Values |
| 1010 | cccc | Add4Byte | Add to 4-byte Values |
| 1011 | cccc | Add8Byte | Add to 8-byte Values |
| 1100 | cccc | InsertByte | Conditional Write-if-Zero |
| 1101 | cccc | WriteByte | Unconditional Write |
| 1110 | cccc | SetByte | Set Masked Bits Within |
| 1111 | cccc | ClearByte | Clear Masked Bits Within |
| | d=0 | Write Only | |
| | d=1 | Write-Read | |
| | eee | Bits Specifying Range Size | |
| | cccc | Response Code Returned | |

FIG. 14

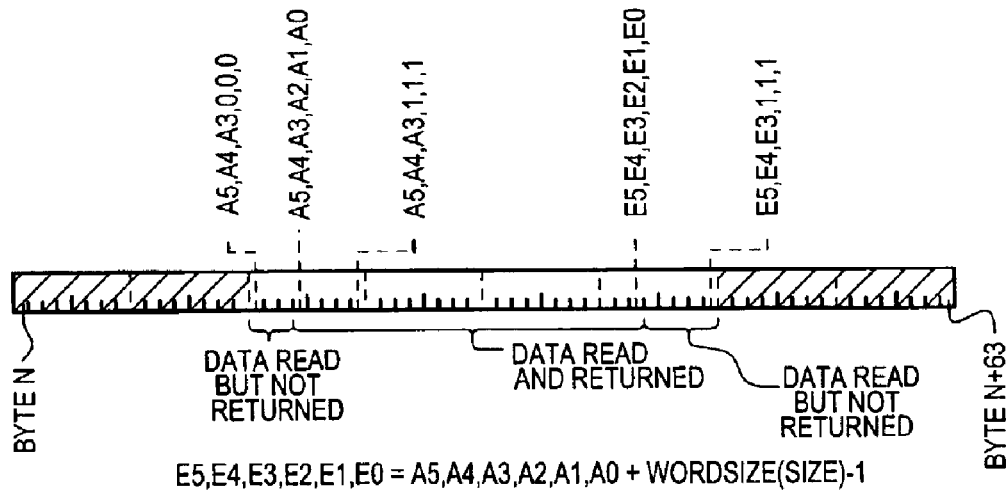
FIG. 15A
| F/S | TARG' | STAT | PRIOR | ADDRESS | | | |
|---|---|---|---|---|---|---|---|
| DATAk | DATAj | DATAi | 0 | 0 | 0 | 0 | 0 |
| 0 | 0 | 0 | DATAr | DATAq | DATAp | DATAo | DATAn |
A2, A1, A0 = 101
FIG. 15B
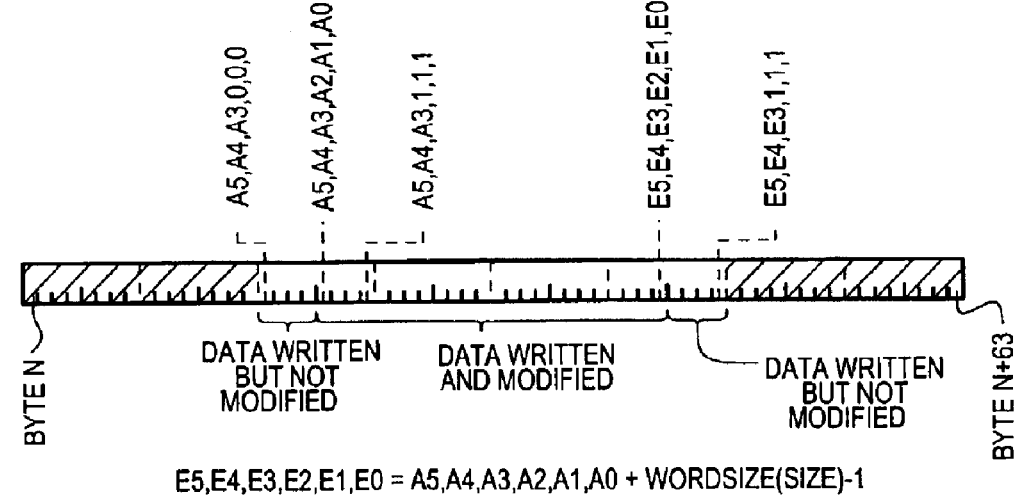
FIG. 16

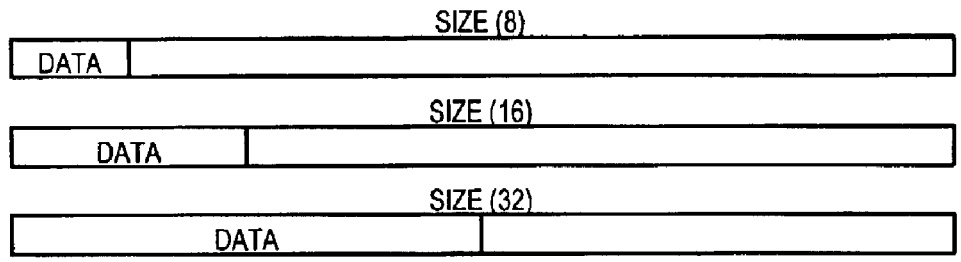
FIG. 26
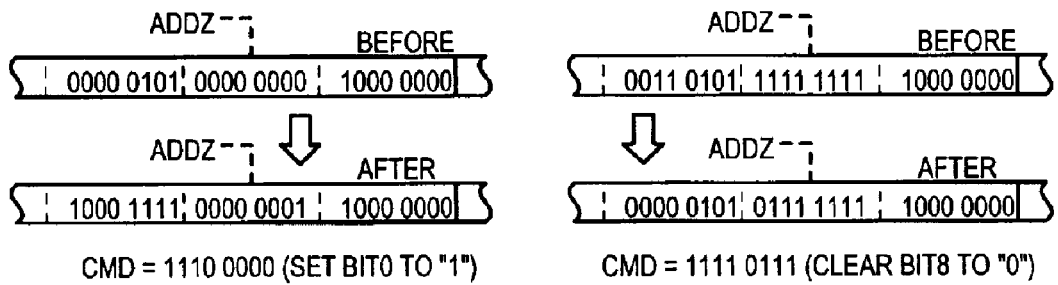
FIG. 27
| ADDZ ⌐ ̄ ̄ BEFORE |
| 0000 0101 ¦ 0000 0000 ¦ 1000 0000 |
⇩
| ADDZ ⌐ ̄ ̄ AFTER |
| 1000 1111 ¦ 0000 0001 ¦ 1000 0000 |
CMD = 1110 0000 (SET BIT0 TO "1")
FIG. 28
| ADDZ ⌐ ̄ ̄ BEFORE |
| 0011 0101 ¦ 1111 1111 ¦ 1000 0000 |
⇩
| ADDZ ⌐ ̄ ̄ AFTER |
| 0000 0101 ¦ 0111 1111 ¦ 1000 0000 |
CMD = 1111 0111 (CLEAR BIT8 TO "0")
FIG. 29

| ADD | EN0 | EN1 | EN2 | EN3 | EN4 | EN5 | EN6 | EN7 |
|-----|-----|-----|-----|-----|-----|-----|-----|-----|
| 000 | 1 | 1 | 1 | 1 | 1 | 1 | 1 | 1 |
| 001 | 0 | 1 | 1 | 1 | 1 | 1 | 1 | 1 |
| 010 | 0 | 0 | 1 | 1 | 1 | 1 | 1 | 1 |
| ... | | | | | | | | |
| 111 | 0 | 0 | 0 | 0 | 0 | 0 | 0 | 1 |

MODE=RANGE
FIRST WORD=1
LAST WORD=0
OR
MODE=Add8Byte

FIG. 31A

| ADD | EN0 | EN1 | EN2 | EN3 | EN4 | EN5 | EN6 | EN7 |
|-----|-----|-----|-----|-----|-----|-----|-----|-----|
| 000 | 0 | 0 | 0 | 0 | 0 | 0 | 0 | 0 |
| 001 | 1 | 0 | 0 | 0 | 0 | 0 | 0 | 0 |
| 010 | 1 | 1 | 1 | 0 | 0 | 0 | 0 | 0 |
| ... | | | | | | | | |
| 111 | 1 | 1 | 1 | 1 | 1 | 1 | 1 | 0 |

MODE=RANGE
FIRST WORD=0
LAST WORD=1

FIG. 31B

| ADD | EN0 | EN1 | EN2 | EN3 | EN4 | EN5 | EN6 | EN7 |
|-----|-----|-----|-----|-----|-----|-----|-----|-----|
| XXX | 1 | 1 | 1 | 1 | 1 | 1 | 1 | 1 |

MODE=RANGE
FIRST WORD=0
LAST WORD=0

FIG. 31C

| ADD | EN0 | EN1 | EN2 | EN3 | EN4 | EN5 | EN6 | EN7 |
|-----|-----|-----|-----|-----|-----|-----|-----|-----|
| 000 | 1 | 1 | 0 | 0 | 0 | 0 | 0 | 0 |
| 001 | 0 | 1 | 0 | 0 | 0 | 0 | 0 | 0 |
| 010 | 0 | 0 | 1 | 1 | 0 | 0 | 0 | 0 |
| ... | | | | | | | | |
| 111 | 0 | 0 | 0 | 0 | 0 | 0 | 0 | 1 |

MODE=Add2Byte

FIG. 31D

| ADD | EN0 | EN1 | EN2 | EN3 | EN4 | EN5 | EN6 | EN7 | |
|-----|-----|-----|-----|-----|-----|-----|-----|-----|---|
| 000 | 1 | 1 | 1 | 1 | 0 | 0 | 0 | 0 | MODE= ADD4BYTE |
| 001 | 0 | 1 | 1 | 1 | 0 | 0 | 0 | 0 | |
| 010 | 0 | 0 | 1 | 1 | 0 | 0 | 0 | 0 | |
| 111 | 0 | 0 | 0 | 0 | 0 | 0 | 0 | 1 | |

FIG. 31E

| ADD | SHIFT | |
|-----|-------|---|
| 000 | 0 | MODE != RANGE |
| 001 | 1 | |
| 010 | 2 | |
| 111 | 7 | |

FIG. 32A

| ADD | SHIFT | |
|-----|-------|---|
| XXX | 0 | MODE = RANGE |

FIG. 32B

| qqq | B0 | B1 | B2 | B3 | B4 | B5 | B6 | B7 | |
|-----|----|----|----|----|----|----|----|----|---|
| 000 | 1 | 0 | 0 | 0 | 0 | 0 | 0 | 0 | MODE=SetBit (OP=OR) |
| 001 | 0 | 1 | 0 | 0 | 0 | 0 | 0 | 0 | |
| 111 | 0 | 0 | 0 | 0 | 0 | 0 | 0 | 1 | |

FIG. 33A

| qqq | B0 | B1 | B2 | B3 | B4 | B5 | B6 | B7 | |
|-----|----|----|----|----|----|----|----|----|---|
| 000 | 0 | 1 | 1 | 1 | 1 | 1 | 1 | 1 | MODE=ClearBit (OP=AND) |
| 001 | 1 | 0 | 1 | 1 | 1 | 1 | 1 | 1 | |
| 111 | 1 | 1 | 1 | 1 | 1 | 1 | 1 | 0 | |

FIG. 33B

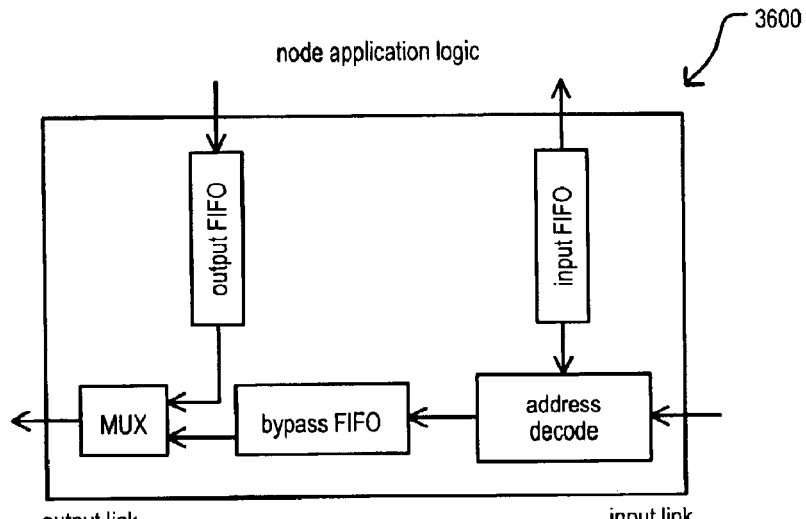
FIG. 36
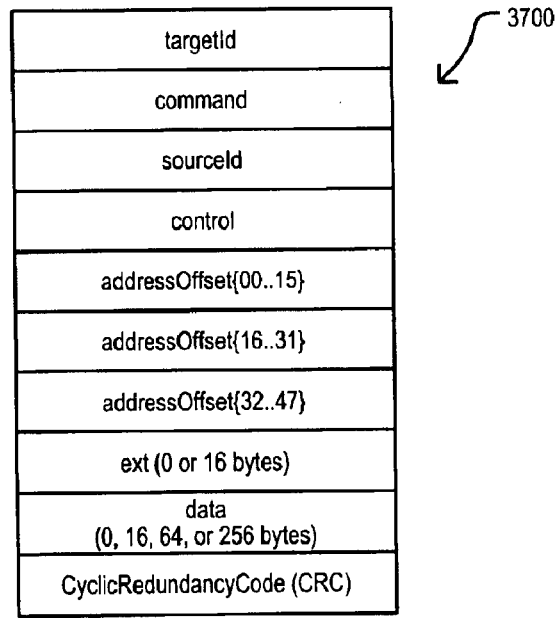
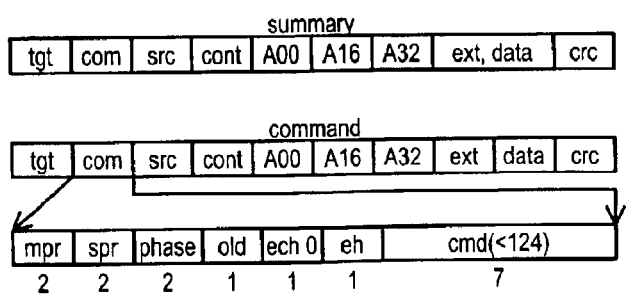
FIG. 37

RANDOM ACCESS MEMORY (RAM) METHOD OF OPERATION AND DEVICE FOR SEARCH ENGINE SYSTEMS

This application claims the benefit of provisional application Ser. No. 60/343,973 filed Dec. 27, 2001.

TECHNICAL FIELD

The present invention relates generally to random access memories (RAMs), and ore particularly to RAMs for search engine systems.

BACKGROUND OF THE INVENTION

Search engine systems may typically include a device for comparing search keys (also called comparands) with a number of stored data values. Do to the rapid matching capabilities of content addressable memories (CAMs), search engine systems can include one or more CAM devices. A CAM device can include circuitry for performing one or more types of search operations. In a search operation, a comparand (or key) may be compared to multiple entries to see if all or a portion of the key matches an entry. After a search operation, a CAM device may give a search result as an output. Typically a search result may include an "index" value that may be used to access associated data.

Because storing associated data on a CAM device itself may consume undue device area, it may be desirable to provide one or more memory devices, such as random access memory (RAM) devices to store such associated data.

To better understand the various features and aspects of search engine systems that may include RAM devices, a number of conventional search engine systems will now be described.

A first conventional search engine system is shown in FIG. 34 and designated by the general reference character 3400. A conventional search engine system 3400 may include a host 3402, one or more CAM devices 3404, and a RAM sub-system 3406. A RAM sub-system 3406 may include RAM devices 3406-0 to 3406-i. A host device 3402 may include one or more processor devices, and may issue search commands for a system, as well as receive search result data. In the particular example of FIG. 34, a host 3402 may issue search commands to a CAM device 3404. In response to such commands, a CAM device 3404 may provide data, such as an index value to a host 3402. A host 3402 may then access one of the RAM devices 3406-0 to 3406-i to retrieve associated data. In some conventional approaches, an index value provided by a CAM device 3404 may be a portion of an address for accessing an entry of a RAM device (3406-0 to 3406i).

A host 3402 may also have to continually update associated data. Such "housekeeping" operations can typically involve common operations on a range of addresses.

Referring now to FIG. 34, a typical conventional RAM device (3406-0 to 3406-i) may include a chip select input CS, address inputs (A0–An), and data input/outputs (I/Os) (D0–Dx). As is well understood, a conventional RAM device (3406-0 to 3406-i) can be enabled according to logic at a corresponding chip select input CS.

Address inputs (A0–An) of RAM devices (3406-0 to 3406-i) can be commonly connected to an address bus 3408 and data I/Os (D0–Dx) can be commonly connected to a data bus 3412. Each chip select input CS can be connected to a different chip select line. Such different chip select lines are shown in FIG. 34 as item 3410.

Thus, in order to read associated data, a host 3402 may activate one of chip select lines 3410 and drive an address value on address bus 3408. In response, the RAM device (3406-0 to 3406-i) receiving that active chip select signal may drive data bus 3412 with data stored at the supplied address. Similarly, in order to update associated data in a RAM device (3406-0 to 3406-i), a host 3402 may activate one of chip select lines 3410 and drive an address value on address bus 3408 and write data on data bus 3412. In response, the RAM device (3406-0 to 3406-i) receiving that active chip select signal can store data on data bus 3412 at the supplied address.

While FIG. 34 illustrates an arrangement in which a host 3402 may generate addresses for accessing associated data, alternate conventional approaches may include arrangements in which a CAM device may issue such addresses. One such conventional approach is shown in FIG. 35 and designated by the general reference character 3500. A system 3500 may include a host 3502, one or more CAM devices 3504 and a RAM sub-system 3506. Unlike the arrangement of FIG. 34, in FIG. 35, a CAM device 3504 may apply address and control signals to a RAM sub-system to thereby place associated data on a data bus 3508.

An important feature of many CAM based systems can be the rate at which associated data may be generated and/or updated. Consequently, it is desirable to increase the overall rate at which associated data values within such RAM devices can be accessed and updated.

A drawback to conventional approaches, like those shown in FIGS. 34 and 35 can be the complexity in, and/or lack in uniformity of connections to such RAM devices (3406-0 to 3406-i). As associated data amounts are increased, a number or capacity of RAM devices (3406-0 to 3406-i) may also increase. In the latter case, more and more address lines may be needed and corresponding RAM devices may have to include additional address inputs. Additional address inputs can increase system layout space. Larger address inputs (i.e., chip pinouts) may increase component cost.

In the event RAM device numbers are increased, it may be increasingly difficult to layout chip select lines, or the like, to have a same signal latency, as each chip select line may have a separate route and/or different loading than shared address or data bus lines. As a result, in order to achieve as high a processing rate as possible, a host may have to adapt to different delays between RAM devices, as such delays may depend on a RAM device's location with respect to a host. Still further, RAM device speeds (the speed at which data may be written or read) can also vary, adding to the complexity of a host operation.

Yet another drawback to conventional approaches, like that of FIG. 34, can be added difficulty or complexity in supporting multiprocessor and/or multithreaded environments. In such environments it can be desirable for one processor (or thread) to accesses a given memory device to perform an operation while other processors (or threads) compete for a same memory device and/or a common bus that accesses such memory devices. In such an environment, it can be difficult to implement methods of controlling access to memory devices, such as a method that can "lock" an access path between a processor (or thread) and a memory device, or methods that attempt to maintain a cache coherence for accesses by multiple processors (or threads) to a common memory space.

The IEEE Scalable Coherent Interface (I.E.E.E. Standard 1596-1992), referred to herein as SCI, discloses an interface for providing the higher throughput needed in multiprocessor systems. Such an interface may include point-to-point links between SCI nodes. An example of such an SCI node is shown in FIG. 36, and designated by the general reference character 3600. An SCI node 3600 may include an output multiplexer (MUX) that may receive data from a bypass first-in-first-out (FIFO) memory and output FIFO. SCI also discloses arrangements in which a grid of processors may be interconnected by rings. In such a configuration, each processor may include two SCI nodes.

An example of an SCI request packet is set forth in FIG. 37, and designated by the general reference character 3700. A request packet may include a target field (targetId), a command field (command), source field (sourceId), and an error check field (CyclicRedundancyCode (CRC)). Thus, an SCI request packet may have a minimum size of 16 bytes.

Within an SCI packet, a target field may include 16 bits that can indicate a designated destination for a request. A command field may also include sixteen bits, and is shown in more detail in FIG. 37. A command field may include a 7 bit portion, shown as "cmd(<124)" that can specify a particular operation to be performed.

An SCI command can include response expected commands (see SCI, Page 69, Table 3–8) and responseless-subaction commands (see SCI, Page 70, Table 3–9). Such responseless-subaction commands are directed to data move operations, and vary from response expected commands by various bit values. Further, various commands specify transactions of only predetermined size (e.g., 16, 64, 256 response bytes).

While SCI can provide a scalable interface for multiprocessor based systems, it is always desirable to increase performance in a system, particular the rate at which requests may be processed in the case of a search engine system.

SUMMARY OF THE INVENTION

According to the present invention, a method of operating a memory device can include executing a predetermined operation on stored data in response to a command, and optionally returning the stored data in response to no more than two bit values of the command. Such a command may be less than nine bits allowing for a compact command format.

According to one aspect of the embodiments, predetermined operation can include any of the following: writing data to a memory device location of the stored data, adding a predetermined value to the stored data, logically ORing a predetermined value to the stored data, logically ANDing a predetermined value to the stored data, incrementing the stored data by a predetermined value, decrementing the stored data by a predetermined value, and writing data to a memory device location of the stored data if the stored data has a predetermined value.

According to another aspect of the embodiments, in the case of a predetermined operation that adds a predetermined value to stored data, a resulting sum may be written to a memory address of the stored data. However, carries can be restricted along predetermined bit boundaries.

According to another aspect of the embodiments, a method may also include optionally returning the stored data in response to one bit of the command.

According to another aspect of the embodiments, a method may also include executing a predetermined operation on data values stored in a range of memory addresses. Such a range of memory addresses can begin with a start address and end with an end address. A range can be determined by no more than four bits of a command.

According to another aspect of the embodiments, a method may also include storing data values as words having at least four data value portions that are accessible according to lower significance bits. Further, executing a predetermined operation on data values stored in a range of memory addresses can include accessing a different combination of data value portions for each different combination of the lower significance bits for a first word of the range of address values.

According to another aspect of the embodiments, a method may also include, for a last word of a range of address values, accessing a different combination of data value portions for each different combination of lower significance bits.

According to another aspect of the embodiments, a method may also include, for a word between a first word and a last word of a range of memory addresses, accessing all data value portions.

According to another aspect of the embodiments, a method may also include distinguishing predetermined operations on data values stored in a range of addresses from predetermined operations on a data value at a single address according to a single bit of the command.

According to another aspect of the embodiments, a method may also include, for a subset of the predetermined operations, returning a predetermined code value derived from no more than four bits of the command.

According to another aspect of the embodiments, a method may also include determining if a command is intended for the memory device according to target information included with the command. In addition, a command can be executed if the target information matches predetermined target data for the memory device.

The present invention may also include a semiconductor memory device having an output port for providing command data received by at least one input port and for providing result data generated in response to the command data. A memory device may also include a memory core that executes indivisible operations in response to predetermined commands, the indivisible operations including writing modified data to a memory location. The modified data being generated by modifying data read from the memory location.

According to one aspect of the embodiments, an output port can be a point-to-point connection.

According to another aspect of the embodiments, command data can be no more than 8 bits.

According to another aspect of the embodiments, a semiconductor memory device can also include a first vote portion that generates an output result value from at least two input result values. A first vote portion can have a first input coupled to the memory core and a second input coupled to at least one output port.

According to another aspect of the embodiments, a semiconductor memory device may also include a second vote portion that generates an output result value from at least two input result values. A second vote portion can have a first input coupled to a first input port and a second input coupled to a second input port.

According to another aspect of the embodiments, a semiconductor memory device can include at least two output ports. Each output port can provide command data received by at least one input port and can provide result data generated in response to the command data.

According to another aspect of the embodiments, a memory core of a semiconductor device can access data values of M*N bits. In addition, a memory core may include M data paths, each including N data bits. A decoder circuit can selectively enable different numbers of data paths according to lower significance bits of an address.

According to another aspect of the embodiments, a memory core of a semiconductor device can access data values of M*N bits. In addition, memory core can include an arithmetic logic unit (ALU) coupled to the data paths. An ALU may execute predetermined operations in response to command data. The predetermined operations can include any of the following: adding a predetermined value to a data value stored in the memory core, logically ORing a predetermined value to a data value stored in the memory core, logically ANDing a predetermined value to a data value stored in the memory core, incrementing a data value stored in the memory core, decrementing a data value stored in the memory core, and outputting a received data value if a data value stored in the memory core has a predetermined value.

The present invention may also include a system having a number of memory components, at least one content addressable memory (CAM) component, and at least one host processing component. A host processor component can be connected to at least a first and second of the memory components, and in addition, can be connected to a CAM component. A CAM component can be connected to at least one of the memory components and the host processing component.

BRIEF DESCRIPTION OF THE DRAWINGS

FIG. 10 is a block diagram of a voting operation according to one embodiment.

FIGS. 11A and 11B are state diagrams showing a "request" operation and a "response" operation, respectively, of a memory device according to an embodiment.

FIG. 12 is a block diagram of a memory device request according to an embodiment.

FIG. 13 is a block diagram of a memory device response according to an embodiment.

FIG. 14 is a table showing examples of command codes according to an embodiment.

FIGS. 15A and 15B are block diagrams showing a "ReadRange" operation according to an embodiment.

FIG. 16 is a block diagram showing a "WriteRange" operation according to an embodiment.

FIG. 26 is a block diagram showing a data format according to an embodiment.

FIG. 27 is a table showing examples of other command codes according to an embodiment.

FIG. 28 is a block diagram of a SetBit operation according to an embodiment.

FIG. 29 is a block diagram of a ClearBit operation according to an embodiment.

FIGS. 31A to 31E are truth tables illustrating the operation of an amplifier decoder according to an embodiment.

FIGS. 32A and 32B are truth tables illustrating the operation of a shift decoder according to an embodiment.

FIGS. 33A and 33B are truth tables illustrating the operation of a bit operation decoder according to an embodiment.

FIG. 36 is a block diagram of a scalable coherent interface (SCI) node.

FIG. 37 is a block diagram of an SCI request packet format.

DETAILED DESCRIPTION OF THE EMBODIMENTS

Various embodiments will now be described in conjunction with a number of diagrams.

Figure 1:
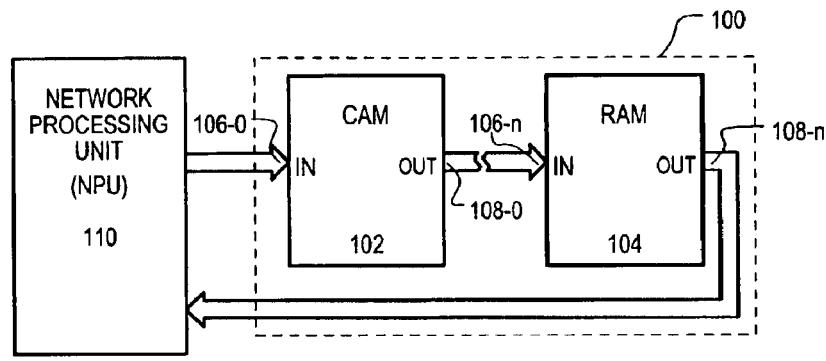
FIG. 1 is a block diagram of search engine system according to a first embodiment.

Referring to FIG. 1, a first embodiment of a system is set forth and designated by the general reference character 100. A first embodiment 100 may include at least one content addressable memory (CAM) device 102 arranged in a cascade configuration with at least one memory device 104. Both a CAM device 102 and memory device 104 may include an input port and output port, where such input port is different than an output port. Accordingly, in the arrangement shown in FIG. 1, CAM device 102 may include input port 106-0 and output port 108-0, while memory device 104 may include input port 106-n and output port 108-n.

Input ports (106-0 and 106-n) may preferably be unidirectional, receiving data on multiple signal lines. In addition, input ports (106-0 and 106-*n*) may include multiple inputs that are not dedicated to address or data values. Thus, unlike a conventional RAM device that may include a number of inputs or outputs dedicated for address or data signals, in the present invention, inputs port 106-*n* may include inputs that can receive data or address or control or other information, and are not dedicated to a particular type of signal. Such non-dedicated inputs may result in lower complexity in a system wiring.

In a similar fashion, output ports (108-0 and 108-*n*) may preferably be unidirectional, providing data on multiple signal lines. Also, like input port 106-*n*, output port 108-*n* may not be dedicated to provide a particular type of signal (e.g., only data).

Accordingly, unlike conventional search engine systems, data may flow in a single direction through a system 100. In particular, a command data issued by a device, such as a network processing unit (NPU) 110, can flow through all devices beginning with a first device, in this case CAM device 102 and eventually to a last device, in this case memory device 104. In a similar fashion, a result data generated in response to such command data may flow from a first device and eventually from a last device to a command issuing device (e.g., an NPU 110).

As will be described in more detail below, a memory device 104 may receive result data from a previous device in a cascade flow. A memory device 104 can compare its own current result data with that of a previous device in a flow (such as another memory device), and generate an output response. An output response may be selected from between the previous and current response and/or include a new, different response when the current and previous responses have predetermined values. Such an operation of generating one response from two different received responses will be referred to herein as response "voting."

Response voting can enable one memory device to provide a response to a next memory device in a flow, or as an output value in the case of a last memory device in a cascade flow. Thus, an output port 108-*n* of a last device 104 in a flow may provide a response selected from, or generated in response to, responses for all devices of a system 100.

In one very particular arrangement, a memory device may be a random access memory (RAM) that can store associated data for a search engine. Such associated data may be accessed according to commands generated by a CAM device 102. In addition, such associated data may be updated with commands issued by an NPU 110.

Figure 2:
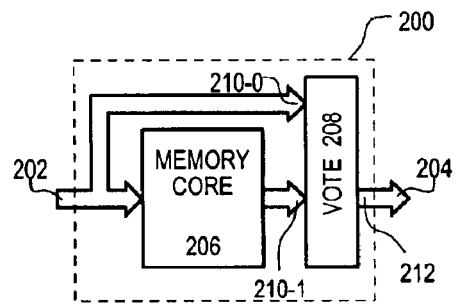
FIG. 2 is a block diagram of memory device according to a first embodiment.

Referring now to FIG. 2, one example of a memory device according to a first embodiment is shown in FIG. 2 and designated by the general reference character 200. A memory device 200 may include an input port 202 as described above, an output port 204 as described above, a memory core portion 206, and a vote portion 208.

A memory core portion 206 may include circuits for performing one or more memory related functions. Such memory related functions may include read operations and write operations. In addition, memory related functions may include various operations that may be performed on data within such a memory device. Such operations may include setting a bit (e.g., setting to a logical "1"), clearing of a bit (e.g., setting to a logical "0"), incrementing a stored value, or decrementing a stored value. In addition, or alternatively, such operations can be an arithmetic/logic operation between a supplied value and a data value. In a preferred embodiment, arithmetic/logic operations may include a Boolean ORing, a Boolean ANDing, and binary addition, with carrying being limited to a particular byte-wise boundary. Further, an arithmetic/logic operation may include a conditional write, in which a supplied data value is written only if data at the address has a predetermined value (e.g., zero).

Of course, while such stored values may be of various sizes, such values may be preferably common data widths for memory devices (e.g., 32-bit values, 64-bit values, etc.).

According to the present invention, memory related functions may also include "range" functions. Such range functions may perform one or more of the above-indicated operations for data values in an address range (e.g., modify all bytes in a given address range).

Various particular examples of such operations will be described at a later point herein.

Referring still to FIG. 2, a vote portion 208 may include circuits for selecting between multiple search responses and/or generating a new response from received multiple responses.

In the example of FIG. 2, a vote portion 208 includes a first vote input 210-0 that receives a "remote" response, and a second vote input 210-1 that receives a "local" response. A remote response may be a result generated from a previous memory device in a cascaded chain. A local response may be a result generated from a memory core portion 206.

To better understand particular operations according to a first embodiment, an example of a request flow and response flow will now be described with reference to FIGS. 3A and 3B.

Figure 3A:
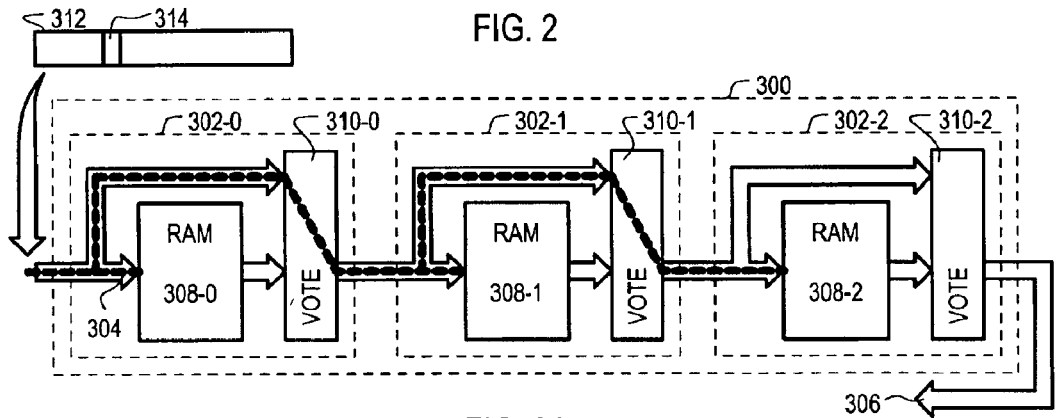
FIGS. 3A and 3B are block diagrams showing the operation of a system according to one embodiment.
Figure 3B:
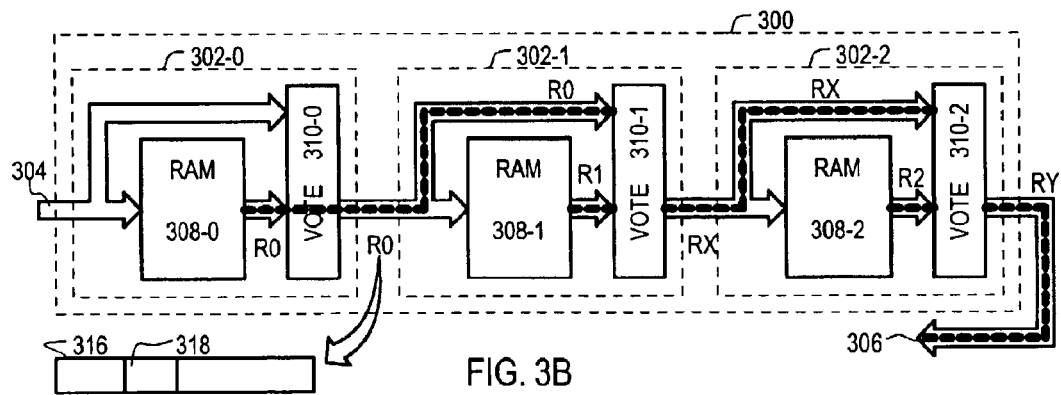

Referring now to FIGS. 3A and 3B an example of a system according to a second embodiment is set forth in a block diagram and designated by the general reference character 300. In the particular example of FIGS. 3A and 3B, a system 300 can include three memory devices 302-0 to 302-2 arranged in a single serial cascade. Thus, memory device 302-0 may be a memory device and include an input port 304 that may receive requests. Similarly, a memory device 302-2 may be a last device and include an output port 306 that may provide a request or a response.

Each memory device (302-0 to 302-2) can have the same general structure as that shown in FIG. 2. Thus, memory devices 302-0 to 302-2 may include memory core portions 308-0 to 308-2, respectively, and vote portions 310-0 to 310-2, respectively.

FIG. 3A shows a request flow for a system 300. In particular, a flow for a received request 312 is represented by a bold and dashed line. As shown in FIG. 3A, a request 312 may be received by a first memory device 302-0 at input port 304. The request may then be applied to memory core portion 308-0. The same request may flow through a first memory device 302-0 to a next memory device 302-1, via vote portion 310-0. Like the first memory device 302-0, within a second memory device 302-1 the request may be applied to memory core portion 308-1 and the same request may flow through a second memory device 302-1 to a next memory device 302-2. In the example of FIG. 3A, a third memory device 302-2 is a last memory device. Consequently, a request may be applied to a memory core portion 3082. Such a request may be passed on to an output port 306 or alternatively, prevented from being output.

In this way, a request may flow through cascaded memory devices in a single flow direction.

FIG. 3A also shows an example of a request 312. Unlike conventional approaches, a request 312 may include a transaction bit 314. A transaction bit 314 may indicate to a memory device (302-0 to 302-n) whether or not a response is to be generated. This is in contrast to other protocols that may have an entire multi-bit command dedicated to indicate that no response is to be generated. That is, conventional approaches do not distinguish between commands that generate responses and commands that do not generate responses according to a single bit.

FIG. 3B shows a response flow for a system 300 following the application of a request, as shown in FIG. 3A. In FIG. 3B it is assumed that a transaction bit 314 within request 312 is set to a value (e.g., 1) that indicates a response is to be generated from such a request.

A resulting response flow is represented by a bold and dashed line. As shown in FIG. 3B, upon receiving a request, a memory core portion 308-0 within first memory device 302-0 may generate a response, shown as R0. A response R0 may be applied to a next memory device 302-1 in the cascade, via vote portion 310-0.

Within second memory device 302-1, a response R0 may be applied to a vote portion 310-1. In addition, in response to a same previous request, a memory core portion 308-1 within second memory device 302-1 may generate its own response, shown as R1. Such a response can also be applied to vote portion 310-1. A vote portion 310-1, according to predetermined criteria, may select between two received responses R0 or R1, or generate a new response. A response provided by vote portion 310-1 is shown as RX in FIG. 3B. Such a response RX may then be applied to any subsequent memory device 302-2 in a cascade.

Within third memory device 302-2, a response RX may be applied to a vote circuit 310-2. In the same general fashion as described above, a memory core portion 308-2 within a third memory device 302-2 may generate its own response, shown as R2. Such a response is also applied to vote portion 310-2. A vote portion 310-2 may generate a response RY based on two received responses RX and R2.

In this way, multiple responses may be generated by cascaded RAM devices in response to a request. However, a single response may be output based upon predetermined "voting" criteria.

Response R0 is additionally shown in FIG. 3B as item 316 to illustrate how a response may include a particular response target code 318. A response target code 318 may differentiate a response from a request.

It is understood that the flows shown in FIGS. 3A and 3B should not be construed as exclusive in time. As but one example, while a request is still flowing through a subsequent memory device, a first memory device (such as 302-0) may have already generated a response.

While FIGS. 3A and 3B show an arrangement that may allow for a serial cascading of memory devices, it may be desirable to increase a rate at which requests are processed by memory devices. Accordingly, the present invention can also encompass cascaded memory device architectures that include one or more parallel branches. Such an embodiment will now be described with reference to FIGS. 4 and 5A to 5D.

Figure 4:
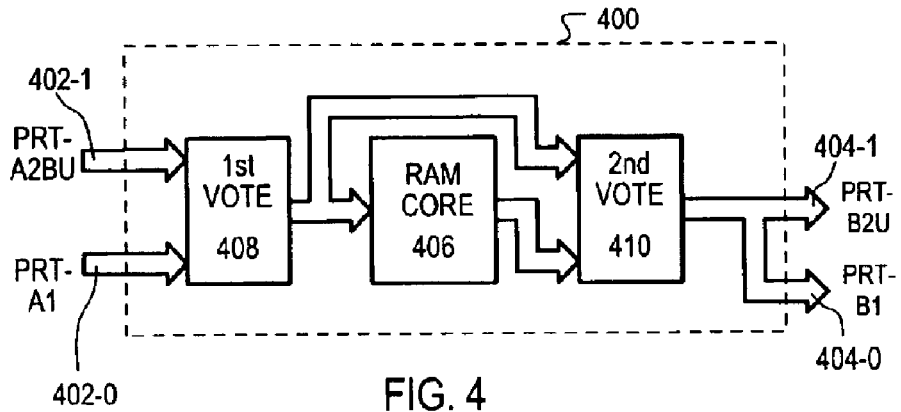
FIG. 4 is a block diagram of a memory device according to another embodiment.

FIG. 4 shows a memory device according to a second embodiment. A memory device is designated by the general reference character 400 and may include at least a first input port 402-0 and a second input port 402-1, and at least a first output port 404-0 and a second output port 404-1. A memory device 400 may further include a memory core portion 406, a first vote portion 408, and a second vote portion 410.

Input ports (402-0 and 402-1) may essentially match one another in structure. Either input port (402-0 and 402-1) may receive a request from a previous memory device or requesting device. In addition, each input port (402-0 and 402-1) may receive a different response from previous memory devices in different legs of parallel cascade chains. Preferably, connections to input ports (402-0 and 402-1) are point-to-point.

Output ports (404-0 and 404-1) may both pass on a received request. For example, a single request may be output on both output ports (404-0 and 404-1) and thus provide the ability to "branch" requests. Thus, first output port 404-0 may provide a request to one branch of parallel branches, and second output port 404-1 may provide the same request to another branch of the parallel branches.

A first vote portion 408 may receive multiple incoming responses and according to predetermined criteria, select one response or generate a new response as an output. Such a response may then be applied to a second vote portion 410. In one particular arrangement, a first vote portion 408 may serve to pass on an incoming request to a memory core portion 406 and to a second vote portion 410.

A memory core portion 406 can provide the same general responses as the memory core portion shown as item 206 in FIG. 2. Thus, a memory core portion 406 may receive a request and generate a local response.

A second vote portion 410 may have the same essential structure as the vote portion shown as item 208 in FIG. 2. Thus, a second vote portion 410 can receive a "remote" response from a previous memory device in a cascade, as well as a local response from memory core portion 406. A second vote portion 410 may then generate a response and provide it to output ports (404-0 and 404-1).

Figure 5A:
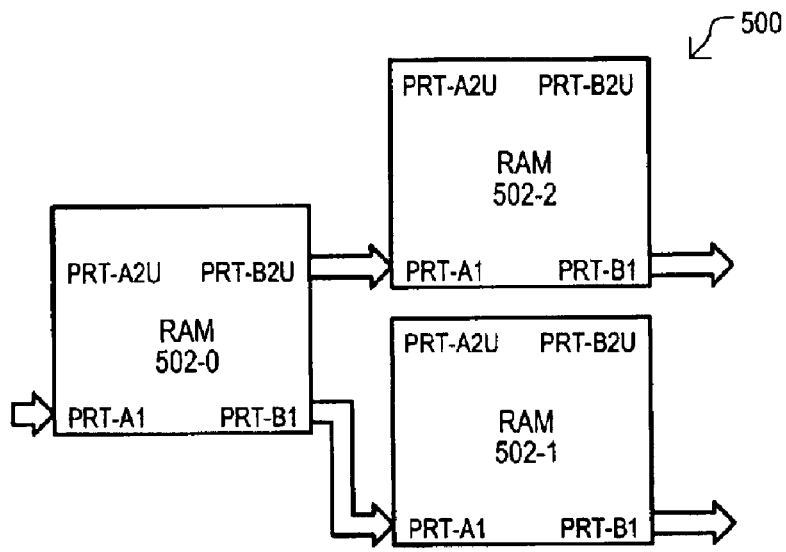
FIGS. 5A and 5B are block diagrams showing branching in a system according to one embodiment.
Figure 5B:
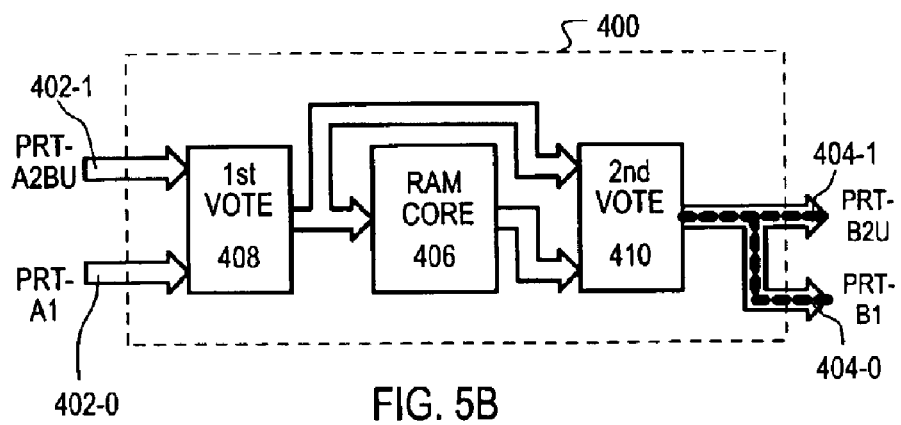
Figure 5C:
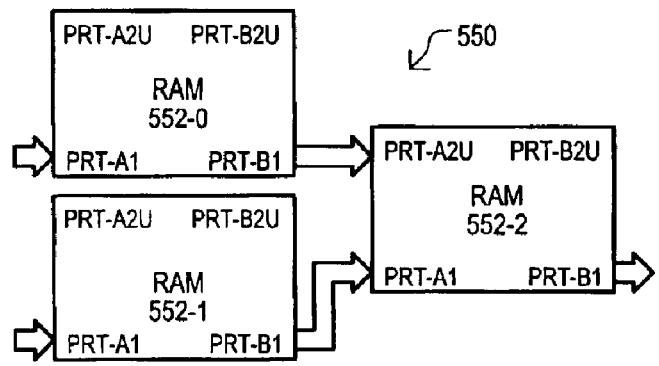
FIGS. 5C and 5D are block diagrams showing branch merging in a system according to one embodiment.
Figure 5D:
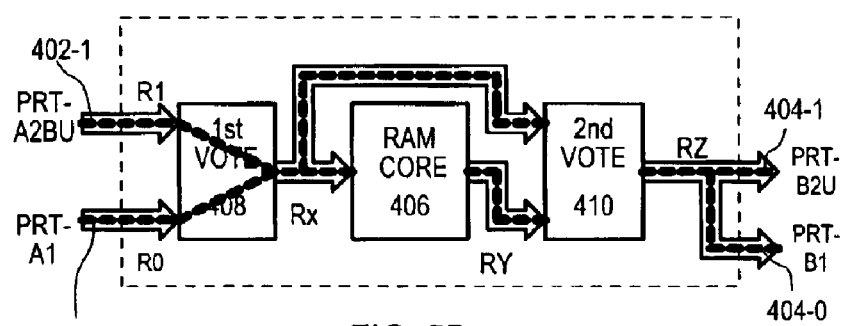

Various branching cases will now be described with reference to FIGS. 5A to 5D. FIGS. 5A and 5B show the beginning of a cascade branch. FIGS. 5C and 5D show an end of a cascade branch.

Referring to FIG. 5A, a system is designated by the general reference character 500 and is shown to include a "branching" memory device 502-0, a first branch memory device 502-1, and a second branch memory device 502-2. A branching memory device 502-0 may receive a request, and pass on such a request to both first and second branch memory devices (502-1 and 502-2). Similarly, a branching memory device 502-0 may generate a response, and pass such a response on to both first and second branch memory devices (502-1 and 502-2).

In the particular example of FIG. 5A, it is assumed that a branching memory device 502-0, first branch memory devices 502-1, and second branch memory device 502-2 have the same general structure as memory device 400 in FIG. 4. Thus, branching memory device 502-0 has a first output port (PRT-B1) connected to a first input port (PRT-A1) of first branch memory device 502-1, and a second output port (PRT-B2U) connected to a first input port (PRT-A1) of second branch memory device 502-2.

A data flow for a branching memory device, such as that shown as 502-0 in FIG. 5A, is shown in FIG. 5B. FIG. 5B shows a memory device having the same arrangement as FIG. 4, thus like portions will be referred to by the same reference characters. In FIG. 5B, an output from second vote portion 410 (shown as bold and dashed lines) may flow to output ports 404-0 and 404-1. It is noted that such output data may include a request originally received at an input port (402-0, 402-1) or a response generated by a second vote portion 410.

While the memory system 500 shown in FIG. 5A shows an example of how cascaded memory system of the present invention may include the start of a branching chain, system 550 of FIG. 5C illustrates how the present invention may include an end of a branching chain.

Referring to FIG. 5C, another memory system is shown and designated by the general reference character 550. A memory system 550 may include a first branch memory device 552-0, a second branch memory device 552-1, and a "merging" memory device 552-2. A merging memory device 552-2 may receive a response from both a first and second branch memory device (552-0 and 552-1), and select from between such responses or generate a new response to thereby provide a remote response. A merging memory device 552-2 may further generate its own local response, and provide an output response based on the remote response and local response.

In the particular example of FIG. 5C, it is assumed that a first branch memory device 552-0, second branch memory device 552-1, and merging memory device 552-2 have the same general structure as memory device 400 in FIG. 4. Thus, first branch memory device 552-0 has a first output port (PRT-B1) connected to a second input port (PRT-A2U) of a merging memory device 552-2, and second branch memory device 552-1 has a first output port (PRT-B1) connected to a first input port (PRT-A1) of a merging memory device 552-2.

A data flow for a merging memory device, such as that shown as 552-2 in FIG. 5C, is shown in FIG. 5D. FIG. 5D shows a memory device having the same arrangement as FIG. 4, thus like portions will be referred to by the same reference character.

FIG. 5D shows an example of a response flow through a merging memory device 400. A response flow is shown by a bold and dashed line. A merging memory device 400 may receive a response R0 (from a second branch memory device, such as 552-1) at a first input port 402-0. A merging memory device 400 may also receive another response R1 (from a first branch memory device, such as 552-0). A first vote portion 408 may vote on such remote responses (R0 or R1) according to predetermined criteria to generate a remote response RX.

A remote response RX may then be applied to a second vote portion 410. In addition, a local response RY, generated by a memory core portion 406 may also be applied to a second vote portion 410. A second vote portion 410 may then vote between remote response RX and local response RY, to thereby provide an output response RZ. An output response RZ may then flow to output ports (404-0 and/or 404-1).

Of course, it is understood that first response R0, second response R1, and local response RY may all correspond to a common request previously applied to memory devices in a system.

Figure 6A:
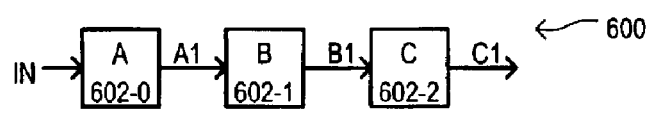
FIGS. 6A and 6B show a system architecture and timing according to an embodiment.
Figure 6B:
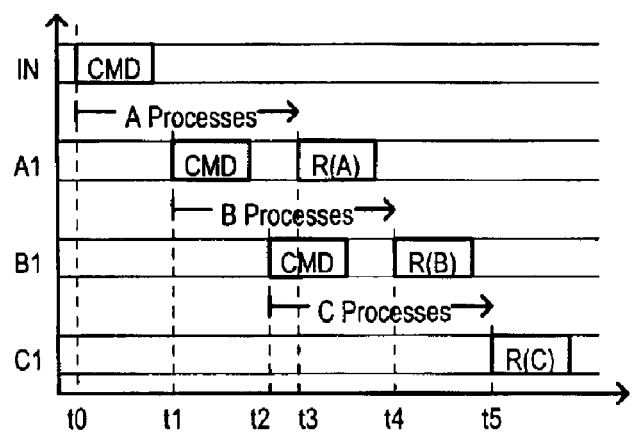

Referring now to FIGS. 6A and 6B, an example of a system and timing for such a system is shown. FIG. 6A is a block diagram of a single branch system architecture 600. In FIG. 6A, three memory device components are arranged in series: memory device "A" 602-0, memory device "B" 602-1, and memory device "C" 602-2. Memory device A 602-0 may have an input port (IN) that receives requests. An output port of memory device A 602-0 may be connected to an input port of memory device B 602-1 on connection A1. Similarly, an output port of memory device B 602-1 may be connected to an input port of memory device C 602-2 on connection B1. A response may be provided from memory device C 602-2 on a connection C1.

Each memory device (602-0 to 602-2) may process requests and responses with the same latency. Thus, responses may follow requests on a same connection. Such an arrangement is shown in FIG. 6B.

FIG. 6B is a timing diagram showing an input port (IN), and connections A1, B1 and C1, as described above. A typical request-response operation will now be described with reference to FIG. 6B.

At time t0, a request, shown as CMD (command), may be received at input port IN. Upon receiving request CMD, memory device 602-0 may begin processing the request. Such a processing time is shown as "A Processes."

At time t1, the request CMD has propagated through memory device A 602-0, even as memory device A 602-0 is generating a response. Thus, the request CMD is transmitted on connection A1 to memory device B 602-1. Upon receiving the request, memory device B 602-1 also begins processing the request. Such a processing time is shown as "B Processes."

At time t2, the request CMD has propagated through memory device B 602-1, even as memory device B 602-1 is generating a response. CMD is thus transmitted on connection B1 to memory device C 602-2. Upon receiving the request, memory device C 602-2 can also begin processing the request CMD. Such a processing time is shown as "C Processes."

At time t3, memory device A 602-0 completes a processing of request CMD, and generates a corresponding response R(A). Such a response R(A) may be sent to memory device B 602-1 over a connection A1.

At time t4, memory device B 602-1 completes a processing of request CMD, and generates an output response from a local internally generated response and remote response R(A). An output response can then be provided on connection B1 to memory device C 602-2 as response R(B).

At time t5, memory device C 602-2 completes a processing of request CMD, and generates an output response from a local internally generated response and remote response R (B). An output response can then be provided on connection C1 as response R(C).

It is noted that processing times for each memory device can be essentially the same. Consequently, time amounts t5-t2, t4-t1 and t3-t0 may be essentially the same. Of course, such a feature may be arrived at by having all memory devices in such a cascade be essentially identical. Internal memory device operations may be timed according to a common clock signal, or the like.

Figure 7A:
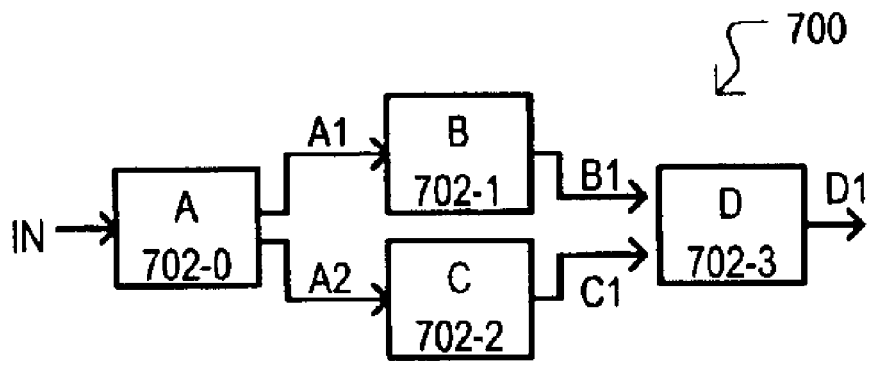
FIGS. 7A and 7B show a system architecture and timing according to another embodiment
Figure 7B:
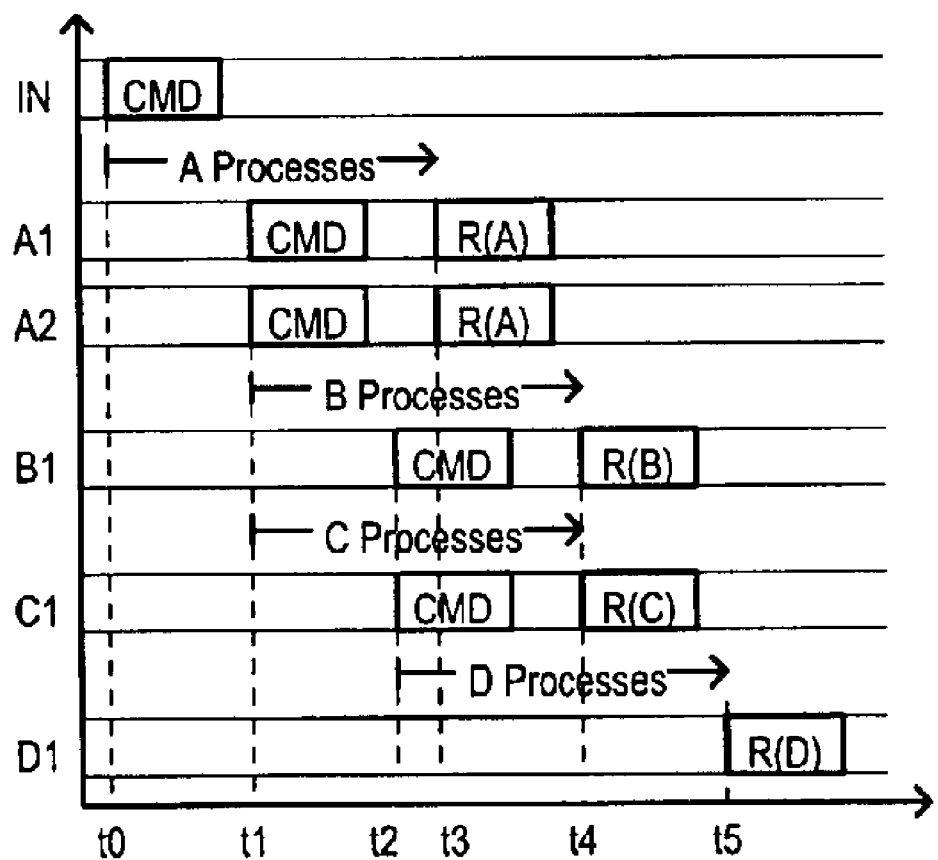

Referring now to FIGS. 7A and 7B, an example of a system having multiple branches and timing for such a memory system is shown. Conventions of FIGS. 7A and 7B follow that of FIGS. 6A and 6B. Accordingly, a detailed description will be omitted.

FIGS. 7A and 7B show how a memory system may include multiple branches in parallel, with each branch having one or more memory devices. Results from such branches may be sorted in merging memory devices. Such a parallel arrangement can allow for faster processing rates as requests may be processed by multiple branches in parallel. Still further, a number of branches can be expanded, allowing processing rates to scale up. However, overall latency between a request and response may remain the same (assuming all branches of a parallel group maintain the same latency).

Figure 8A:
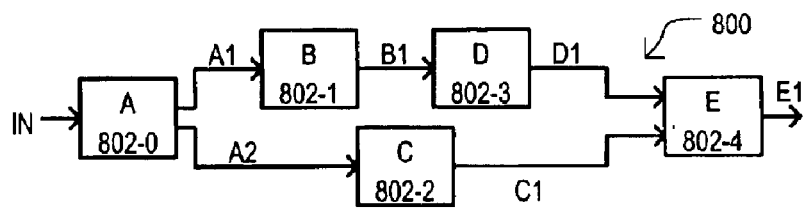
FIGS. 8A and 8B show a system architecture and timing according to another embodiment
Figure 8B:
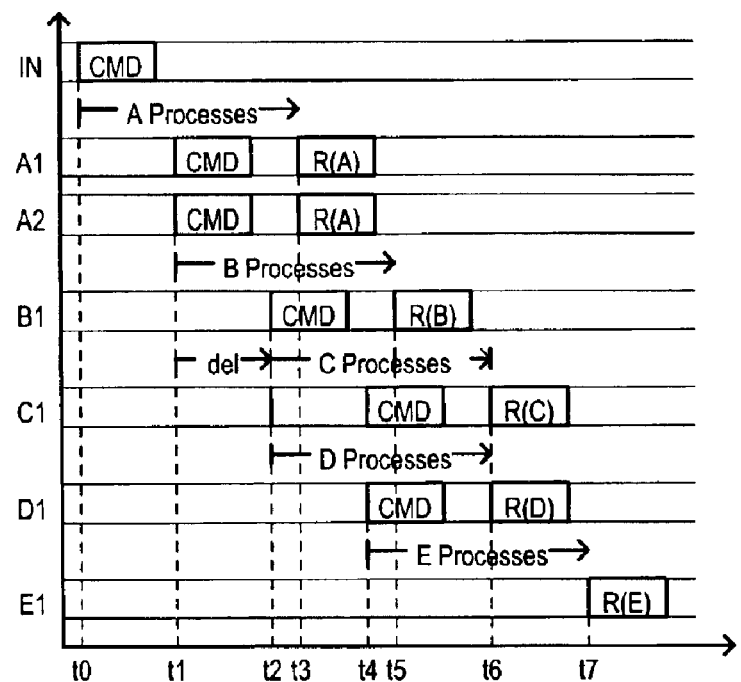

Referring now to FIGS. 8A and 8B, an example of a memory system having multiple branches with different timings is shown. In FIG. 8A, a system 800 can include various memory components, including a branching memory device "A" 802-0, a first branch that includes a memory device "B" 802-1 and a memory device "D" 802-3. A second branch may include memory device "C" 802-2. First and second branches may be merged at a merging memory device "E" 802-4.

In FIGS. 8A–8B, a total number of series connected memory devices in each branch is different (a first branch has two devices, and a second branch has one device). Consequently, if each memory device response is generated according to a same latency value, a response from a memory device D 802-3 would arrive at merging memory device E 802-4 at a different time than a response from a memory device C 802-2.

According to the embodiment of FIGS. 8A and 8B, a system may include a timing element to synchronize responses between branches that might otherwise have different processing latencies.

One particular approach is shown in FIG. 8B. In FIG. 8B, a delay may be added to a response generated by a memory device C 802-2. Such a delay can ensure that a response from a memory device C 802-2 can be at one input port of merging memory device E 802-4 at essentially the same time a corresponding response from memory device D 802-3 is at another input port of merging memory device 802-4.

FIG. 8B is a timing diagram showing a request-response operation of the embodiment set forth in FIG. 8A. FIG. 8B shows signals at an input port (IN) and connections A1, A2, B1, C1, D1 and E1.

FIG. 8B shows how a "short" branch (i.e., a branch with fewer series connected memory devices) may have a different overall latency than other branches. In the particular example of FIG. 8B, an overall latency for a memory device C 802-2 may be given by a total of "C processes" and a value "del." A C processes value can be a typical processing time for memory device C 802-2, and may be equal to processing times of other memory devices in a system shown as "A processes," "B processes," etc. A value "del" may be delay introduced into a branch to account for processing differences between branches. Taking into account a compensating delay value "del," a memory device C 802-2 may not allow a request to propagate on to a connection C1 at time t2, but instead will delay such a request until a time t4.

It is understood that within a memory device C 802-2, a processing of a received response may be initially delayed by an amount "del," or a generated result may be held for a delay "del," or some proportional combination thereof may be employed to increase the overall latency of a memory device branch with respect to other slower memory device branches.

Of course, a delay, buffer and/or latch may be introduced into a branch through any of a number of ways. A delay, buffer and/or latch may be introduced within a memory device of a branch, for example, or accounted for by a merging memory device, or introduced by a circuit element separate from the memory devices of a cascade chain. Of course, these are but a few of the possible approaches.

A merging memory device may account for mismatch timing in multiple branches by storing a first received remote response in a first vote portion for comparison with a subsequent second received remote response. This may enable the two responses to be compared with one another. In the case of requests, requests from one branch (the faster branch) may be ignored, or delayed to coincide with request received from a slower branch.

In this way, a memory system may include multiple branches in parallel, with one or more branches having a different number of series connected memory devices, or other aspects that result in mismatch processing latencies between branches. Processing may be delayed on a faster branch to enable requests and/or response to be issued essentially simultaneously from such branches.

Figure 9:
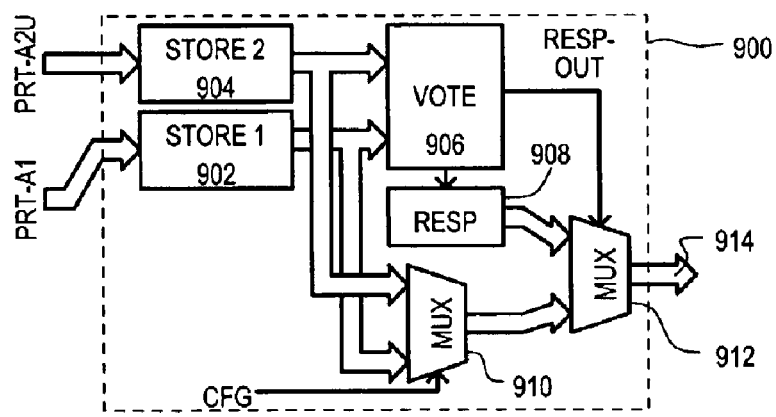
FIG. 9 is a block diagram of a voting circuit according to one embodiment.

Referring now to FIG. 9, a vote portion of a memory device according to one embodiment is set forth in a block schematic diagram. A vote portion may correspond to a first vote portion and/or second vote portion, such as those shown as items 408 and 410, respectively, in FIG. 4. As shown in FIG. 9, a vote portion is designated by the general reference character 900 and may include a first input store 902, a second input store 904, a vote circuit 906, a response store 908, a forwarding multiplexer (MUX) 910, a vote MUX 912, and an output path 914.

First and second input stores (902 and 904) may store all, or selected portions of an input request and/or response generated from a request. For example, if a vote portion 900 is a first vote portion (like that shown as 408 in FIG. 4), an input store (902 and/or 904) may store a request received from an issuing device (e.g., an NPU), either directly, or indirectly by way of a previous memory device in a cascade. In addition, an input store (902 and/or 904) may receive a response from a previous memory device in a cascade. Of course, if an input port corresponding to an input store (902 and/or 904) is not connected to another device, the input store (902 and/or 904) may store no valid data.

As another example, if a vote portion 900 is a second vote portion (like that shown as 410 in FIG. 4), a first input store 902 may store a local response generated from a memory core portion (e.g., item 406 in FIG. 4), while a second input store 904 may store a remote response generated from a previous memory device in a cascade arrangement.

In one very particular embodiment, requests and responses may take the form of data packets. Input stores (902 and 904) may buffer such packets, and forward one or the other according to predetermined criteria.

A vote circuit 906 may receive all, or preferably selected portions of data stored in input stores (902 and 904). According to such data, a vote circuit 906 may select or generate a summary response (e.g., a response based on two received responses) at response store 908. In addition, a vote circuit 906 may generate a result RESP-OUT that can indicate a voting operation is complete.

A forwarding MUX 910 may be preconfigured to forward received requests from either input store (904 or 902). In FIG. 9, a signal CFG may control an operation of a forwarding MUX 910.

A vote MUX 912 may be controlled by a result RESP-OUT. Thus, if a response is not ready, an output from a forwarding MUX 910 may be provided on output path 914. However, if a result RESP-OUT indicates a response is ready, a vote MUX 912 may output a summary response, which can be a response based on two received responses.

Referring now to FIG. 10, one example of a vote circuit operation is illustrated. The vote operation illustrates voting between two received responses. FIG. 10 includes first response data 1000 stored in a first store 1002, second response data 1004 stored in a second store 1006, and a vote circuit 1008. Response data (1000 and 1004) may have a predetermined format. In the example of FIG. 10, response data includes a target field TARG', a status field STATUS, and a priority field PRIORITY. A target field TARG' may distinguish response data from request data. A status field can indicate the precedence of a response with respect to other types of responses. A priority field PRIORITY can indicate a priority of result data with respect to other result data.

Referring again to FIG. 10, a vote circuit 1008 may include a first input IN1 that may receive selected portions of first response data 1000 and a second input IN2 that may receive selected portions of a second response data 1004. In one very particular approach, a vote circuit 1008 may include a magnitude comparator circuit that receives status fields and/or priority fields. Thus, if a status field and/or priority field of one response data (1000 or 1004) has a higher precedence than the other (1004 or 1000), a magnitude comparator may generate a result RESULT that may indicate the higher precedence response data. If however, the status fields have one or more predetermined special values, a comparator or other circuit may detect this, and output a RESULT that overrides or supplements a result from a magnitude comparator and indicates new response data.

Having described the general operation of memory devices according to various embodiments, particular approaches to executing request and response operations will now be described with reference to FIGS. 11A and 11B. FIGS. 11A and 11B are state diagrams showing a "request" operation and a "response" operation, respectively, of a memory device.

Referring to FIG. 11A, a request operation is designated by the general reference character 1100 and may include checking input stores 1102. Such a step may be periodically executed according to system timing to coincide with the arrival of new requests. In addition or alternatively, such a step may also be dependent upon receiving circuits that may flag when a complete request has been stored. If a state 1102 indicates new data has been received, a request operation 1100 may proceed to checking for a valid request 1104. If new data has not been received, a request operation 1100 may return to a state 1102.

Checking for a valid request 1104 may include examining fields of data for predetermined values. If new data is a valid request, a request operation 1100 may copy the request to an output 1106. If new data is not valid, a request operation 1100 may return to a state 1102 (error messages could also be generated).

Copying a request to an output 1106 may include copying all or a portion of a received request to an output port. In this way, a request may propagate through a memory device to another memory device in a cascade, or to a requesting device such as an NPU, or the like.

A requesting operation 1100 can also include applying a valid request to a memory core portion 1108. Such a state may include decoding command information to execute an indicated command in a memory core. Such decoding may include determining from among operations directed to single memory locations, and operations directed to a range of memory locations.

An operation may also include determining a state of a transaction bit 1110. Such a transaction bit state may be utilized in a response operation.

Of course, the steps shown in FIG. 11A can be subject to variation. As but one of the many possible variations, steps 1106 and 1108 may be executed in parallel or reverse order.

In this way, a request operation may be executed in a memory device.

Referring now to FIG. 11B, a response operation is designated by the general reference character 1150 and may include an idle state 1152, in which a memory core may be awaiting a response. Once a command is received, such a command may be executed 1154. A state 1154 may include performing any of the various operations noted above with respect to FIG. 2, and as will be described in more detail at a later point herein.

If an operation is not successfully executed (FAIL), a response operation 1100 may generate error data 1156. If an operation is successful (SUCCEED), a response operation 1150 may, or may not, generate result data depending upon a transaction bit 1158.

It will be recalled that in a preferred approach, command data may include a transaction bit that may indicate whether or not response data may be output. In the particular example of FIG. 11B, if a transaction bit has one value ("0" in this example), a response operation 1150 may return to an idle state 1152. If, however, a transaction bit has another value ("1" in this example), a response operation 1150 may generate result data 1160. Even more particularly, a state 1154 may include a write operation to one or more memory locations (or portions thereof), while a state 1160 may include reading and storing data prior to such a write operation. Thus, a transaction bit of the one value ("0" in this example), can eliminate a read operation that may not be necessary.

If result data or error data has been generated, a response operation 1150 may output such data in a response 1162.

This feature may be advantageous in search engine systems where it may be desirable to perform updates to data.

In this way, a response operation may be executed in a memory device.

Referring now to FIG. 12, a very particular example of a memory device request is set forth in a block diagram and designated by the general reference character 1200. A request 1200 may include various fields of particular sizes. Further, a request may be received as a data packet from a point-to-point connection with a requesting device. A requesting device may include an NPU and/or may include another memory device that is "upstream" in a cascade configuration.

A request 1200 may include a format field F/S, a target field TARG, a command field CMD, a supplementary data field DATAa, and an address field ADDRESS. Optionally, a request 1200 may include operation data RANGE DATA. Preferred byte boundaries are illustrated in FIG. 12 by vertical lines. Thus, in the example shown, it is understood that a format field F/S, a target field TARG, a command field CMD and supplementary data field DATAa may preferably be single byte (e.g., 8-bit) values, resulting in a compact request format. In the particular example of FIG. 12, an address field ADDRESS may be four bytes, and range data, if included in a request, may be four bytes (with all or a portion representing valid data).

It is also understood that while a request is represented with byte boundaries, when a request 1200 is initially received, such bytes may be encoded into other formats. Preferably, such bytes are decoded from 10-bit values having overall DC components more conducive to high-speed transmission.

A format field F/S may serve to indicate a start of a request, and may include additional information, such as packet payload size, for example.

A target field TARG may indicate a particular memory device or devices that a request is intended for. A value in a target field TARG may indicate directed and/or broadcast requests. A directed request may be executed by less than all memory devices in a system. A broadcast request may be executed by all, or some subset, of the memory devices in a system.

A command field CMD may indicate a particular operation for execution in a memory device. In one particular approach, a command field may not only indicate a type of operation, but may include additional information including, but not limited to, address range information, return code information, and a transaction bit, to name but a few examples.

Preferably, commands indicated by a command field are "indivisible." That is, such commands are single commands that are executed by a memory device without interruption. Thus, once a memory device receives such a command, such a command is fully executed.

A supplemental data field DATAa may include data for use in an operation, and/or additional data for further defining a command.

An address field ADDRESS may include a memory address for which a given requested operation is directed. In the case of range functions (described below) such an address can be a first address of a given range. In one very particular approach, a most significant portion of an address field (shown as (CHIP)) may serve as a device identifier. A device identifier may serve to restrict an operation to a given device. Thus, a memory device may ignore a request if such a device identifier does not match one or more predetermined values stored within.

An operation data field RANGE DATA, if included in a request, may include data for use in an operation (e.g., write data). As indicated above, some operations may advantageously exclude such data, as particular write or other data may be determined from a command value (in field CMD and/or field DATAa) alone. This may lead to advantageously compact request formats.

Referring now to FIG. 13, a very particular example of a memory device response is set forth in a block diagram and designated by the general reference character 1300. Like a request, a response 1300 may include various fields of particular sizes. Further, a response may be sent as a data packet on a point-to-point connection to a requesting device. A requesting device may include an NPU and/or may include another memory device that is "downstream" in a cascade configuration.

A response 1300 may include a format field F/S, a target field TARG', a status field STAT, a priority field PRIOR, and an address field ADDRESS. Optionally, a response 1300 may include a response data field RANGE DATA'. Like FIG. 12, in FIG. 13 shows preferred byte boundaries. Further, it is understood that while a response is represented with byte boundaries, when a response is transmitted, such bytes may be encoded into other formats.

A format field F/S may be the same as a format field in FIG. 12.

A target field TARG' may include a particular value that distinguishes a response 1300 from a request (e.g., 1200 of FIG. 12). Thus, if a target field TARG' is an 8-bit target values, of the 256 possible target values, at least one such value may be reserved as a response code.

A status field STAT may indicate a status for a response (e.g., complete, error, etc.). In addition, as noted with reference to FIG. 10, such data may be included in a vote operation that selects or generates a response from two received responses.

A priority field PRIOR may indicate a priority for a response with respect to other responses. Like a status field STAT value, and as noted with reference to FIG. 10, such data may be included in a vote operation that selects or generates a response from two received responses.

An address field ADDRESS can store the same address field value included in a corresponding request.

Response data field RANGE DATA', if included in a response, may include data returned from an operation (e.g., read data).

Referring now to FIG. 14, a table is set forth showing examples of command formats according to an embodiment. FIG. 14 includes columns CMD, NAME, and DESCRIPTION. A column CMD shows various particular examples of command codes for a memory device. Such command codes may be included in a command field of a request. A column NAME gives a name identifier for each command. A column DESCRIPTION gives a description of each command.

In FIG. 14, each command can be a binary value, with some bits being fixed for a given command, and other bits varying according to command parameters. Thus, in FIG. 14, fixed binary values are shown as "I" or "0" while variable bit values are represented by a letter. A key for each variable bit type is set forth at the bottom of FIG. 14.

Referring now to the bottom of FIG. 14, a variable bit value "d" may be a transaction bit value, indicating whether an operation includes the return of data. In particular, if a bit "d" is zero, an operation may include a write function, but no read function. In contrast, if a bit "d" is one, an operation may include a both a read function and a write function. Such a read function may access data that may be included in a response.

Variable bit values "eee" may be size value for an address range. Thus, an address range may be specified by a supplied address and a range size value. Such a range size value may be less than 8, even preferably no more than four bits, even more preferably no more than three bits. This can allow for an address range indication for a command, while still maintaining a relatively small overall command size. This is in contrast to conventional approaches that may restrict operations to particular byte sizes, or include multiple argument commands (e.g., a start address and end address).

Variable bit values "cccc" may specify a value, or portion of a value, that can be returned with response. As but one example, such bit values may form all, or a portion of a value included in a status field, like field STAT shown in FIG. 13.

FIG. 14 shows examples of fifteen possible operations. Such operations will now be described in more detail.

One example of a "ReadRange" operation will be described with reference to FIGS. 15A and 15B. FIG. 15A shows a representation of an address space of a memory device, and includes a number of small "ticks" (vertical lines) that delineate byte addresses. Thus, FIG. 15A shows an address range for 64 bytes.

For the purposes of FIGS. 15A and 15B, it is assumed that a request, like that shown in FIG. 12, is applied with a command field CMD value of "0001 X100." In a ReadRange operation, a transaction bit "d" may be either 0 or 1, as such an operation returns data, but does not write to any locations. A range value, thus, can be 011. It is also assumed that an address field ADDRESS includes at least six address bits A5, A4, A3, A2, A1, A0. A ReadRange request may not include an operation data field RANGE DATA, as only read operations may be executed.

FIG. 15A shows a start address for a range, signified by address bits A5, A4, A3, A2, A1, A0, that may be supplied with a command. For example, referring back to FIG. 12, address bits A5, A4, A3, A2, A1, A0 may be least significant bits of an address field ADDRESS. Also shown is an end address for a range, signified by E5, E4, E3, E2, E1, E0. It is understood that an end address can be arrived at by adding a value WORDSIZE(SIZE)-1 to a start address, where a WORDSIZE can be a word size for a memory device (in this case 8 bytes) and a size value SIZE can be given by range size value (e.g., bits "eee" of FIG. 14).

As but one very particular example, a memory device may extract start address bits from an address field ADD of a request. A size value SIZE may be extracted from a portion of a command filed CMD of the same request (e.g., bits "eee"). Such a size value SIZE may be multiplied by a word size WORDSIZE and one subtracted to arrive at a value WORDSIZE(SIZE)-1. This value may be added to start address bits A5, A4, A3, A2, A1, A0 to arrive at an end address having bits E5, E4, E3, E2, E1, E0.

In the very particular example of FIG. 15A, it is assumed that a memory device can access data on a "word" basis, where such words are 64 bits (e.g., 8 bytes). In FIG. 15A, a range start byte address (A5, A4, A3, A2, A1, A0) does not fall along a word address boundary. Consequently, a word containing such a byte address may be read, but only those portions of such a word corresponding to a start address can be returned as read data. Thus, bytes leading a range start address in a first data word (spanning A5, A4, A3, 0, 0, 0 to A5, A4, A3, 1, 1, 1) are indicated as being read, but not returned. Similarly, bytes following a range end address in a last data word (spanning E5, E4, E3, 0, 0, 0 to E5, E4, E3, 1, 1, 1) are indicated as read, but not returned.

Referring now to FIG. 15B, a ReadRange operation response is shown in a block diagram. In the example shown, data may be returned according to a memory address byte alignment. Consequently, byte value outside a range indicated, but still within an accessed word may be filled by a predetermined value (in this case "00" hexadecimal).

In this way, according to the present invention, a compact command (e.g., 8 bits) may indicate both a read command and an address range for such a read command.

One example of a "WriteRange" operation will now be described with reference to FIG. 16. FIG. 16 includes a same representation of an address space as FIG. 15A.

For the purposes of FIG. 16, it is assumed that a request, like that shown in FIG. 12, is applied with a command field CMD value of "0101 0011." Thus, a bit "d" indicates a write (no read) operation, and an address range value is 011. It is also assumed that an address field ADDRESS includes at least six address bits A5, A4, A3, A2, A1, A0. Finally, an operation data field RANGE DATA can include an eight-byte data value that is to be written into words (or portions thereof) of a given range.

FIG. 16 shows an address range start, signified by address A5, A4, A3, A2, A1, A0, that may be supplied with a command. An address range end is shown as E5, E4, E3, E2, E1, E0, and may be arrived at in the same manner as FIG. 15A.

Like FIG. 15A, in the very particular example of FIG. 16, it is assumed that a range start address (A5, A4, A3, A2, A1, A0) does not fall along a word address boundary. Consequently, a data may be written to a word containing such a byte address, but only those portions including and following a start range address can be modified. Thus, bytes leading a range start address in a first data word (spanning A5, A4, A3, 0, 0, 0 to A5, A4, A3, 1, 1, 1) may not be modified. Similarly, bytes following a range end address in a last data word (spanning E5, E4, E3, 0, 0, 0 to E5, E4, E3, 1, 1, 1) may not be modified.

As noted, the above WriteRange example assumed that a transaction bit "d" was zero, indicating no response. However, if such a transaction bit was set to another value "1", unmodified data could be returned in a response (e.g., data stored prior to such a write operation).

Figure 17A:
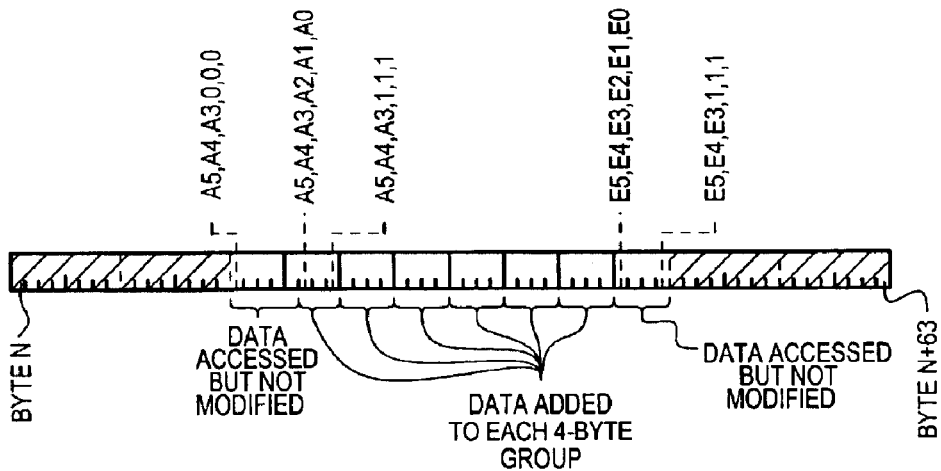
FIGS. 17A and 17B are block diagrams showing an "Add4Range" operation according to an embodiment.

One example of an "Add4Range" range operation will be described with reference to FIGS. 17A and 17B. FIG. 17A shows a representation of an address space of a memory device like that of FIGS. 15A and 16.

Figure 17B:
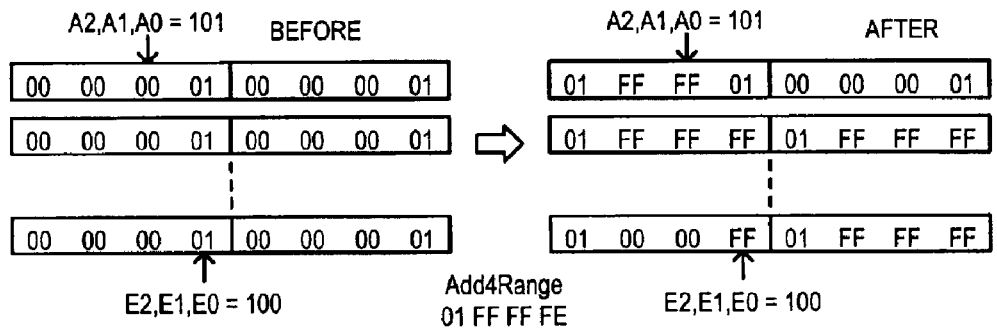

For the purposes of FIGS. 17A and 17B, it is assumed that a request, like that shown in FIG. 12, is applied with a command field CMD value of "0010 0011." Thus, a bit "d" indicates a write (no read) operation, and an address range value is 011. It is also assumed that an address field ADDRESS includes at least six address bits A5, A4, A3, A2, A1, A0. Finally, an operation data field RANGE DATA includes a four-byte data value for addition to existing four byte locations in memory device.

In FIG. 17A a range start address A5, A4, A3, A2, A1, A0 and a range end address may be arrived at in the same manner as describe for FIG. 15A.

FIG. 17A also assumes that a memory device accesses data on a "word" basis, where such words are 64 bits (e.g., 8 bytes). Further, like the WriteRange operation described above, a range start byte address (A5, A4, A3, A2, A1, A0) does not fall along a word address boundaries. Consequently, a word containing such a byte address may be accessed, but only those portions of such a word corresponding to a start range address can be modified. Thus, bytes leading a range start address in a first data word (spanning A5, A4, A3, 0, 0, 0 to A5, A4, A3, 1, 1, 1) are indicated as accessed, but not modified. Similarly, bytes following a range end address in a last data word (spanning E5, E4, E3, 0, 0, 0 to E5, E4, E3, 1, 1, 1) are indicated as accessed, but not modified.

Referring now to FIG. 17B, an Add4Range operation is illustrated by showing word values in a memory device prior to such an operation (BEFORE) and following such an operation (AFTER). In FIG. 15B, it is assumed that data words all store a value of "00 00 00 01 00 00 00 01" (hexadecimal) and operation data (data to be added) includes a four byte value of "01 FF FF FE" (hexadecimal). In addition, address bits A2, A1, A0=101. Thus, for a first word, only the three most significant bytes of the first word are involved in an add operation. Similarly, for a last word, only the least significant five bytes of the last word are involved in the add operation.

Preferably, in an Add4Range operation, addition operations do not carry beyond 4 byte boundaries. In this way, data values may be added to "sub-word" portions of data word locations (e.g., 4-byte sub-word size values added to 4-byte portions of 8-byte values).

Still further, it will be recalled that in this example, a transaction bit "d" was zero, indicating no response. However, if such a transaction bit was set to another value "1", unmodified data could be returned in a response (e.g., data shown as "BEFORE" in FIG. 15B).

One example of an "Add8Range" operation will now be described with reference to FIGS. 18A and 18B.

Figure 18A:
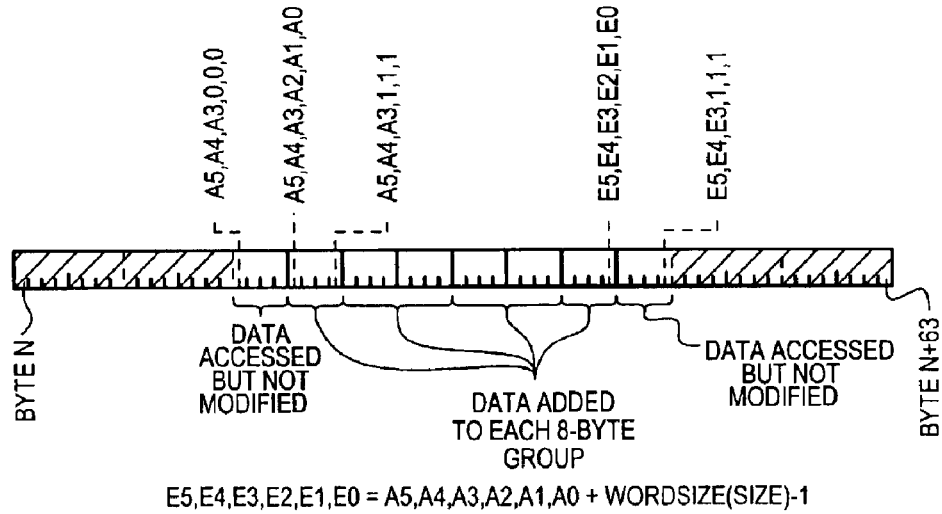
FIGS. 18A and 18B are block diagrams showing an "Add8Range" operation according to an embodiment.
Figure 18B:
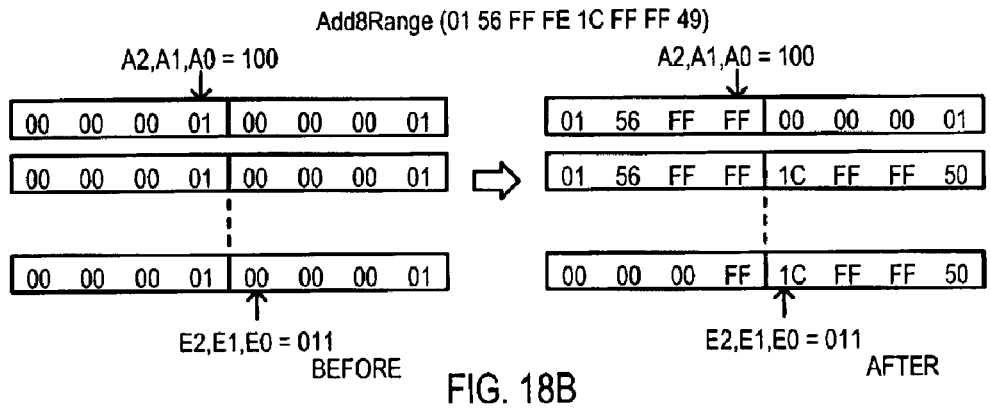

For the purposes of FIGS. 18A and 18B, it is assumed that a request, like that shown in FIG. 12, is applied with a command field CMD value of "001 10011." Thus, a bit "d" indicates a write (no read) operation, and an address range value is 011. It is also assumed that an address field ADDRESS includes at least six address bits A5, A4, A3, A2, A1, A0. Finally, an operation data field RANGE DATA includes an eight-byte data value for addition to exiting eight byte locations in memory device.

FIG. 18A thus generally follows FIG. 17A, showing portions first and last words that are accessed but not modified and portions of first and last words that are accessed and modified.

In FIG. 18B, it is assumed that data words all store a value of "00 00 00 01 00 00 00 01" (hexadecimal) and operation data (data to be added) includes an eight byte value of "01 56 FF FE 1C FF FF 49" (hexadecimal).

In a similar fashion to the Add4Range example in FIG. 17B, in an Add8Range operation, carrying can be restricted along 8-byte boundaries. Also, if a transaction bit in a command was set to another value "1", unmodified data could be returned in a response (e.g., data shown as "BEFORE" in FIG. 18B).

Figure 19:
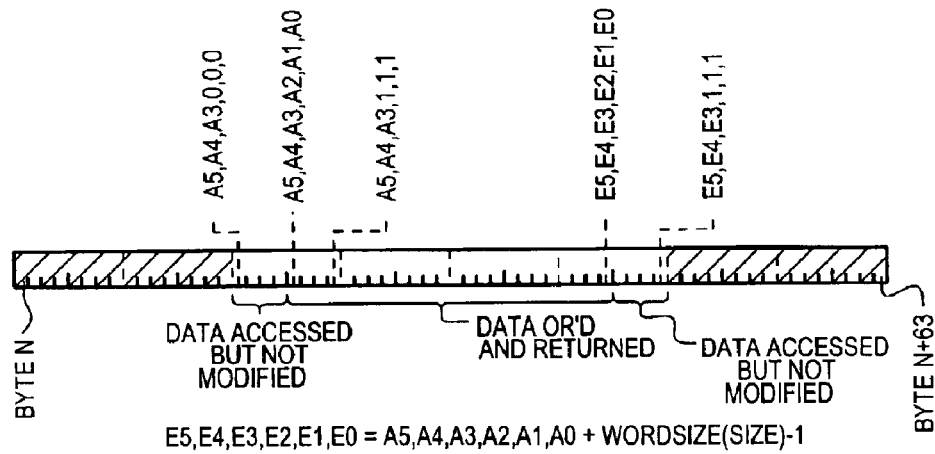
FIG. 19 is a block diagram showing a "SetRange" operation according to an embodiment.

FIG. 19 shows one example of a SetRange operation according to an embodiment. In FIG. 19, address ranges can be established in the same fashion as shown in FIG. 16.

For the purpose of FIG. 19, it is assumed that a request, like that shown in FIG. 12, is applied with a command field CMD value of "0110 0011." Thus, a bit "d" indicates a write (no read) operation, and an address range value is 011. It is also assumed that an address field ADDRESS includes at least six address bits A5, A4, A3, A2, A1, A0. Finally, an operation data field RANGE DATA includes an eight-byte data value to be logically ORed with existing eight byte locations in a memory device.

In the same fashion as FIG. 18A, word portions may be accessed, but not modified when a start address does not fall along a word boundary. Also, if such a transaction bit in a command was set to another value "1", unmodified data could be returned in a response (e.g., data stored prior to a logical ORing of operation data.

Figure 20:
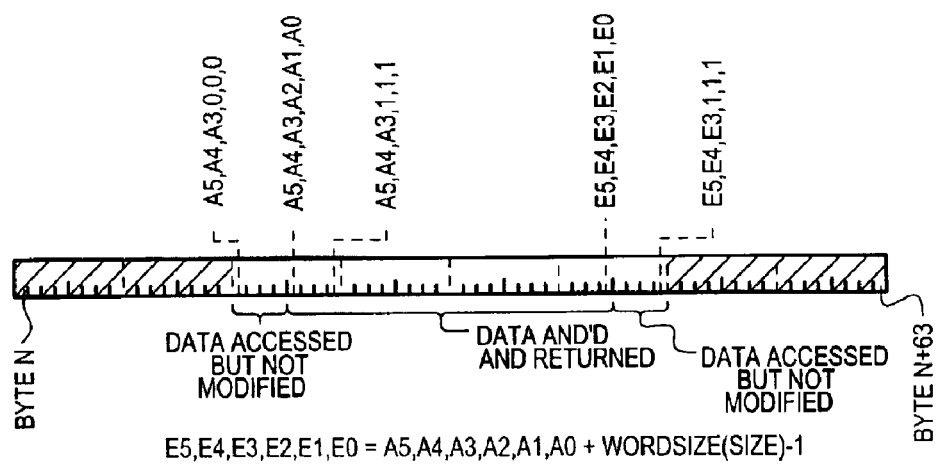
FIG. 20 is a block diagram showing a "ClearRange" operation according to an embodiment.

FIG. 20 shows one example of a ClearRange operation according to an embodiment. A ClearRange operation may essentially be the same as a SetRange operation, except that eight byte operation data can be logically ANDed with corresponding locations in a memory device.

While a memory device according the present invention may provide operations that can affect a range of addresses, in addition or alternatively, a memory device may include operations directed to single addresses. For example, various operations may be directed to a single byte address. Such operations may include those shown in FIG. 14 as Add1Byte, Add2Byte, Add4Byte, Add8Byte, InsertByte, WriteByte, SetByte, and ClearByte.

Figure 21:
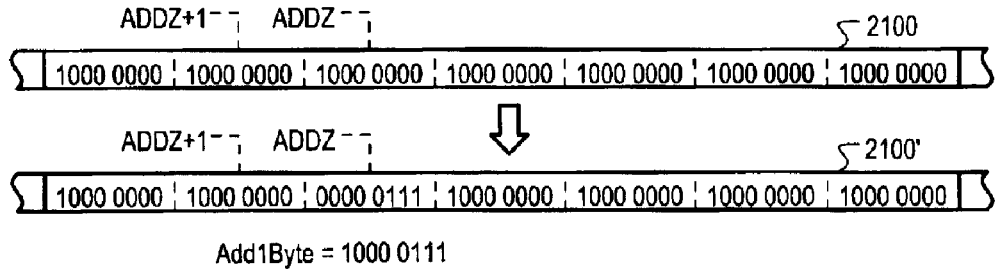
FIG. 21 is a block diagram showing an "Add1Byte" operation according to an embodiment.

Referring to FIG. 21, one example of an Add1Byte operation is set forth in a block diagram. FIG. 21 shows seven data bytes, each of which may have a particular address in a memory device. It is assumed that a request, like that shown in FIG. 12, is applied with a command field CMD value of "1000 0000." Thus, bits "cccc" indicate a return code of 0000. It is also assumed that a supplemental data field DATAa stores a byte value to be added of "1000 0111." Also, an address field ADDRESS includes a value ADDZ. Such a request may not include an operational data field RANGE DATA.

FIG. 21 shows data bytes before 2100 and after 2100' an Add1Byte operation. Prior to such an operation, a data byte at address ADDZ may store a binary value of "1000 0000". An Add1Byte value may add a byte value at the address, preventing carries to a next byte location. Thus, following the example Add1Byte operation, address location ADDZ may store "0000 0111." Next significant byte location (ADDZ+1) remains the same, as any carry data has been prevented from being carried over to such a data byte.

Figure 22A:
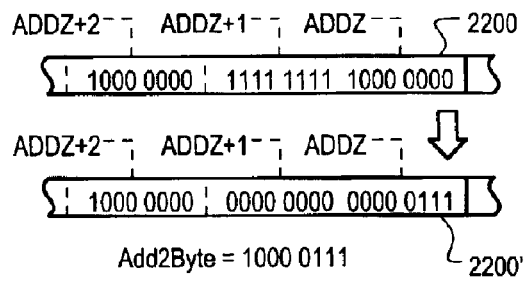
FIGS. 22A and 22B are block diagrams showing an "Add2 Byte" operation according to an embodiment.
Figure 22B:
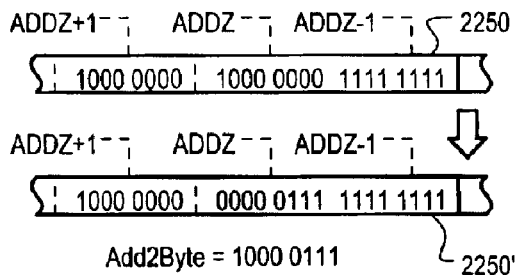

Referring to FIGS. 22A and 22B, two examples of an Add2Byte operation are set forth in block diagrams. FIG. 22A shows two data bytes, each of which may have a particular address in a memory device. It is assumed that a request, like that shown in FIG. 12, is applied with a command field CMD value of "1001 0000." Thus, bits "cccc" indicate a return code of 0000. It is also assumed that a supplemental data field DATAa stores a byte value to be added of "1000 0111." Further, an address field ADDRESS includes a value ADDZ. Such a request may not include an operational data field RANGE DATA.

FIG. 22A shows two data bytes before 2200 and after 2200' an Add2 Byte operation. Prior to such an operation, two data bytes at addresses ADDZ and ADDZ+1 may store a binary value of "1111 1111 1000 0000". An Add2 Byte operation may add a byte value at the address, preventing carries along a two-byte boundary at addresses ADDZ and ADDZ+1. Thus, following the example Add2 Byte operation, address locations ADDZ and ADDZ+1 may store "0000 0000 0000 0111." Next significant byte location (ADDZ+2) remains the same, as any carry data has been prevented from being carried over to such a data byte.

FIG. 22A illustrates and Add2 Byte operation in which a supplied address corresponds to a lower (e.g., even) address byte. According to a very particular embodiment, an Add2 Byte operation corresponding to a higher (e.g., odd) byte address may function differently.

FIG. 22B shows two data bytes before 2250 and after 225' an Add2 Byte operation to a higher of two bytes. Prior to such an operation, two data bytes at addresses ADDZ and ADDZ-1 may store a binary value of "1000 0000 1111 1111". An Add2 Byte operation may add a byte value at a higher of the two addresses (ADDZ), preventing carries to a next byte location (ADDZ+1). Thus, following the example Add2 Byte operation, address locations ADDZ and ADDZ-1 may store "0000 0111 1111 1111." Like FIG. 22A, in FIG. 22B next significant byte location (ADDZ+1) remains the same, as any carry data has been prevented from being carried over to such a data byte.

According to the present invention, an Add4 Byte operation can follow the general functionality described for an Add2 Byte operation, except that carries are limited along 4 byte boundaries. Similarly, for an Add8 Byte operation, carries are limited along an 8-byte (e.g., word) boundary.

Figure 23A:
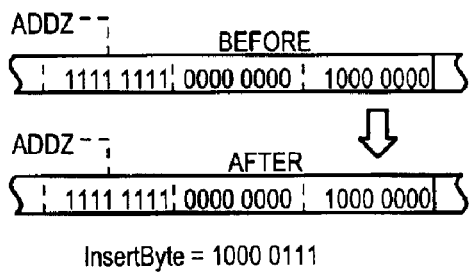
FIGS. 23A and 23B are block diagrams showing an "InsertByte" operation according to an embodiment.
Figure 23B:
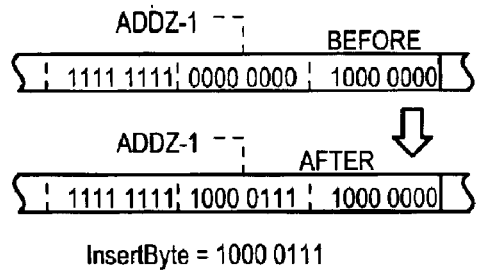

Referring to FIGS. 23A and 23B, two examples of an InsertByte operation are set forth in a block diagrams. FIG. 23A shows two data bytes, each of which may have a particular address in a memory device. It is assumed that a request, like that shown in FIG. 12, is applied with a command field CMD value of "1100 0000." Thus, bits "cccc" indicate a return code of 0000. It is also assumed that a supplemental data field DATAa stores a byte value to be conditionally written of "1000 0111." Further, an address field ADDRESS includes a value ADDZ. Such a request may not include an operational data field RANGE DATA.

FIG. 23A shows a data byte before and after an InsertByte operation. Prior to such an operation, a data byte at addresses ADDZ may store a binary value of "1111 1111." An InsertByte operation may conditionally write a data value to an indicated address. More particularly, if an address location stores zero (e.g., binary 0000 0000), a data byte may be written. However, if an address location does not store a zero, data may not be written. Thus, because a data byte at location ADDZ does not store zero, following an InsertByte operation, such an address location may store a same value of "1111 1111." That is, because a condition is not met (the value is not zero), the data can remain unmodified.

FIG. 23B shows another example of a data byte before and after an InsertByte operation. It is assumed that such an InsertByte operation is directed to an address ADDZ-1. Prior to such an operation, a data byte at addresses ADDZ-1 may store a binary value of "0000 0000." Thus, because a data byte at location ADDZ stores a zero, following an InsertByte operation, such an address location may store a supplied data value of "1000 0111". That is, because a condition is met (the value is zero), the data can be modified.

Figure 24:
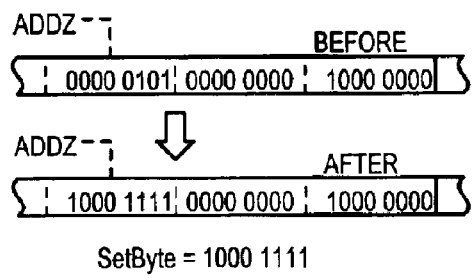
FIG. 24 is a block diagram showing a "SetByte" operation according to an embodiment.

Referring to FIG. 24, an example of a SetByte operation is set forth in a block diagram. FIG. 24 shows a data byte that can have a particular address in a memory device. It is assumed that a request, like that shown in FIG. 12, is applied with a command field CMD value of "1110 0000." Thus, bits "cccc" indicate a return code of 0000. It is also assumed that a supplemental data field DATAa stores a byte value to be logically combined with a stored data value. Such a supplied data value in this example is "1000 0111". Further, an address field ADDRESS includes a value ADDZ. Such a request may not include an operational data field RANGE DATA.

FIG. 24 shows a data byte before and after a SetByte operation. Prior to such an operation, a data byte at addresses ADDZ may store a binary value of "0000 0101". A SetByte operation may logically OR a supplied data value with a stored data value. Thus, following an SetByte operation, a byte at an indicated address (ADDZ) may store the logical "OR" of stored data value 0000 0101 and provided data value 1000 1111, which equals "1000 1111".

Figure 25:
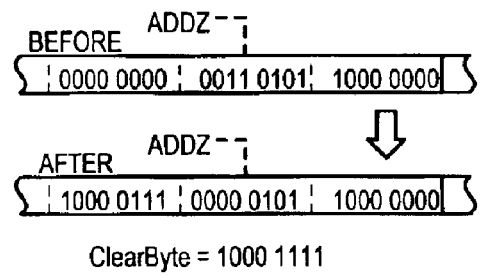
FIG. 25 is a block diagram showing a "ClearByte" operation according to an embodiment.

Referring to FIG. 25, an example of a ClearByte operation is set forth in a block diagram. FIG. 25 shows a data byte that can have a particular address in a memory device. It is assumed that a request, like that shown in FIG. 12, is applied with a command field CMD value of "1110 0000." Thus, bits "cccc" indicate a return code of 0000. It is also assumed that a supplemental data field DATAa stores a byte value to be logically combined with a stored data value. Such a supplied data value in this example is "1000 0111". Further, an address field ADDRESS includes a value ADDZ. Such a request may not include an operational data field RANGE DATA.

FIG. 25 shows a data byte before and after a ClearByte operation. Prior to such an operation, a data byte at addresses ADDZ may store a binary value of "0011 0101". A Clear-Byte operation may logically AND a supplied data value with a stored data value. Thus, following an ClearByte operation, a byte at an indicated address (ADDZ) more store a logical AND of stored data value 0011 0101 and provided data value 1000 1111, which equals "0000 0101".

Referring now to FIG. 26, one example of how different size data may be included in a request and/or provided in a response is set forth in block diagram. As shown, data may be aligned to a least significant bit (LSB) in a frame, or other transmission format. Thus, assuming a particular arrangement in which data may be arranged in 64-bit words, eight bit data may occupy a least significant byte spot, sixteen bit data may occupy the least two significant byte spots, and 32-bit data may occupy the least four significant byte spots.

While various operations indicated in FIG. 12 can allow for compact request information, the present invention may include even more compact forms. Two particular examples are shown in FIG. 27. In FIG. 27, a single command may indicate an operation without including write data. In particular, FIG. 27 shows a SetBit command and a ClearBit command.

FIG. 27 includes the same columns as FIG. 12: CMD, NAME, and DESCRIPTION. Further, like FIG. 14, each command can be a binary value, with some bits being fixed for a given command, and other bits varying according to command parameters. Thus, in FIG. 27, fixed binary values are shown as "1" or "0" while variable bit values are represented by a letter. A key for each letter type is set forth at the bottom of FIG. 27.

A bit value "d" may have the same general function as noted in FIG. 14.

Bit values "ggg" may specify a bit location within an addresses byte. Thus, eight bit values may be modified without having to provide write data.

Referring to FIG. 28, an example of a SetBit operation is set forth in a block diagram. FIG. 28 shows a data byte that can have a particular address in a memory device. As but one example, it can be assumed that a request, like that shown in FIG. 12, is applied with a command field CMD value of "1110 0000." Thus, a bit "d" indicates an operation that does not return a response. Further, bits ggg=0000 can indicate that a first bit (e.g., bit of least significance) is to be set to "1."

FIG. 28 shows a data byte before and after a SetBit operation. Prior to such an operation, a data byte at address ADDZ may store a binary value of "0000 0000". Thus, following an SetBit operation, a byte at an indicated address (ADDZ) may have a least significant bit (determined by ggg=000) set to 1, which can result in a new data value of "0000 0001".

Referring to FIG. 29, an example of a ClearBit operation is set forth in a block diagram. FIG. 29 shows a data byte that can have a particular address in a memory device. As but one example, it can be assumed that a request, like that shown in FIG. 12, is applied with a command field CMD value of "1111 0111." Thus, a bit "d" indicates an operation that does not return a response. Further, bits ggg=111 can indicate that a last bit (e.g., bit of most significance) is to be cleared to "0."

FIG. 29 shows a data byte before and after a ClearBit operation. Prior to such an operation, a data byte at address ADDZ may store a binary value of "1111 1111". Thus, following a ClearBit operation, a byte at an indicated address (ADDZ) may have a most significant bit (determined by ggg=111) cleared to 0, which can result in a new data value of "0111 1111".

In this way, a data byte may be modified according to a single command of no more than eight bits that does not include write data. Further, such a command may optionally return an unmodified data value according to a single bit value.

Figure 30:
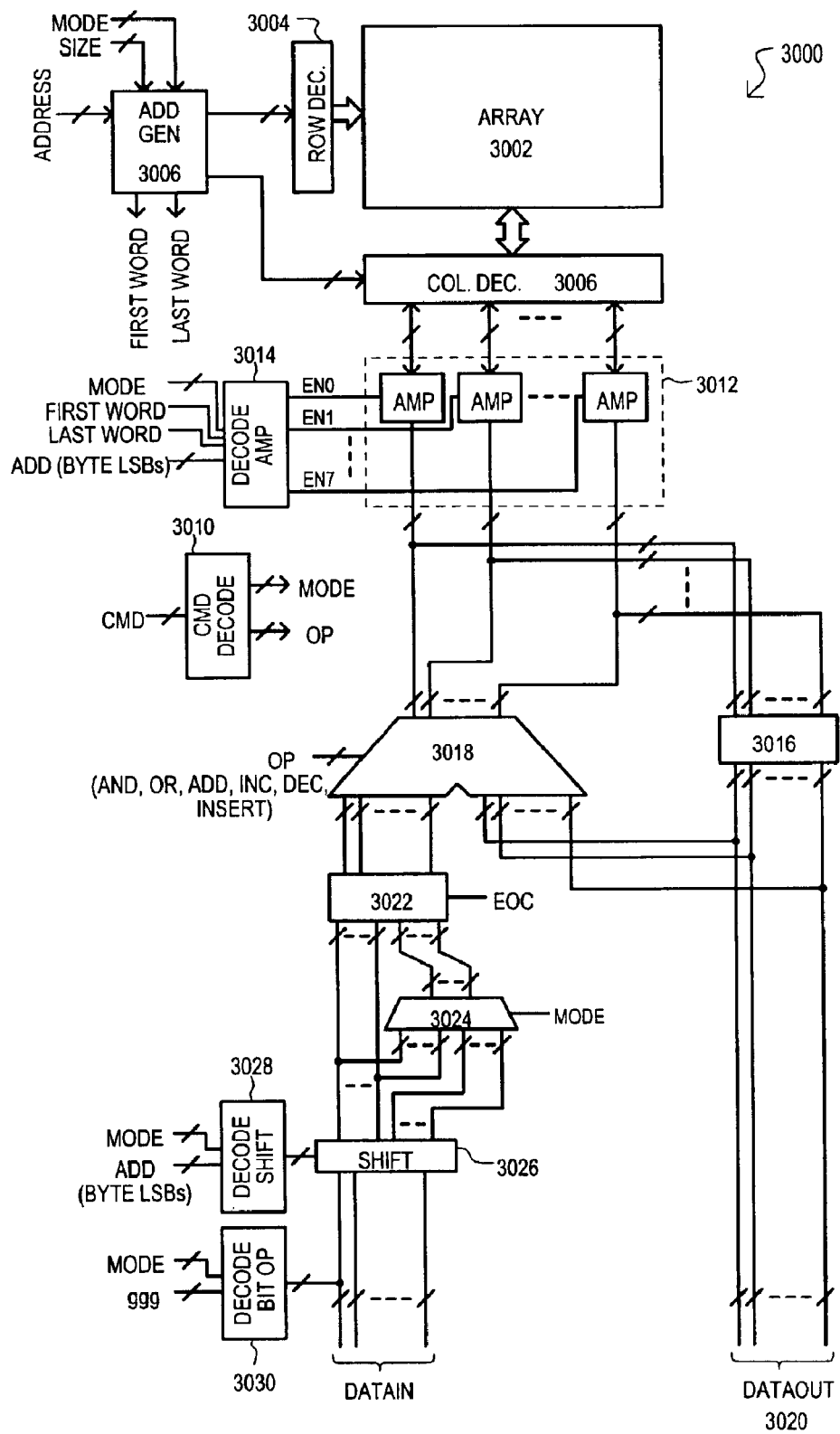
FIG. 30 is a block diagram of a memory device according to an embodiment.
Figure 34:
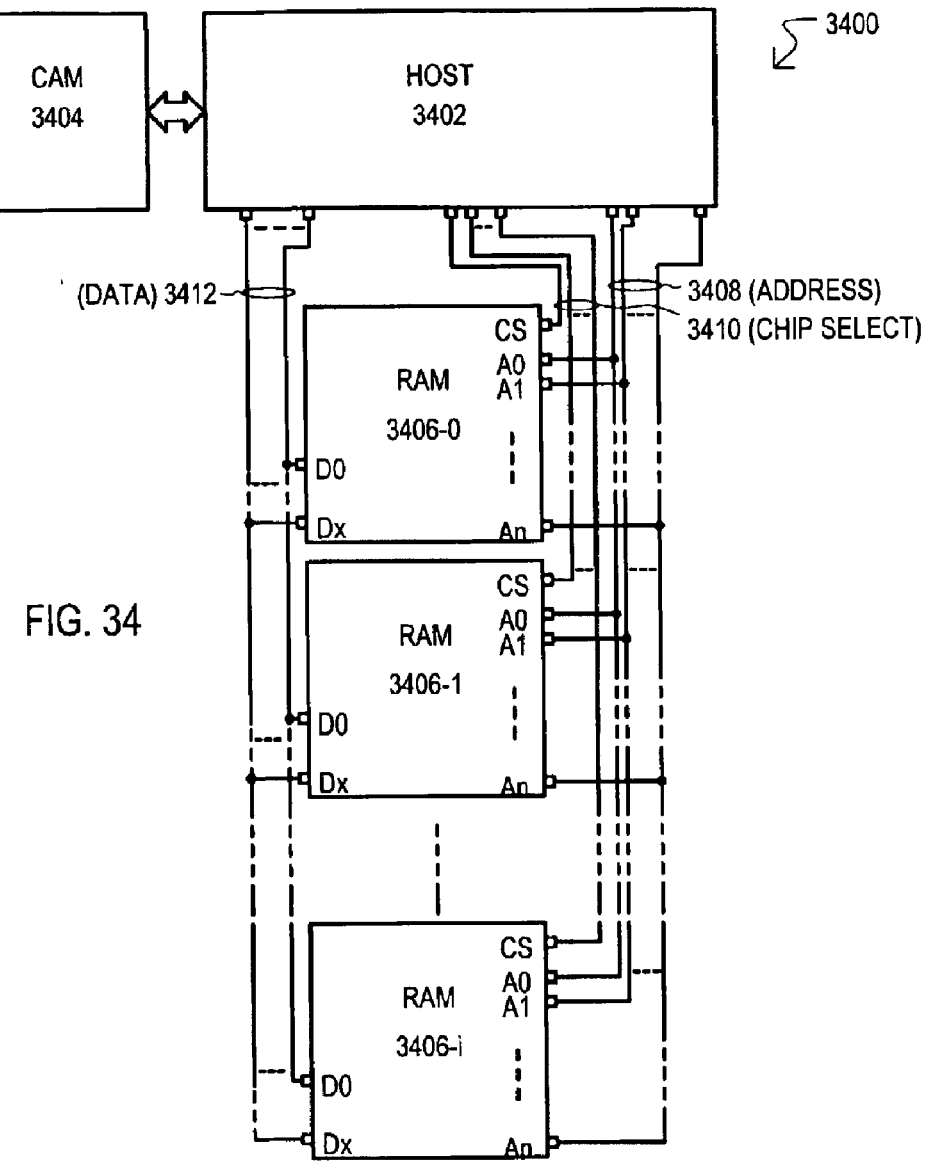
FIG. 34 is a block diagram showing a first conventional search engine system according to an embodiment.
Figure 35:
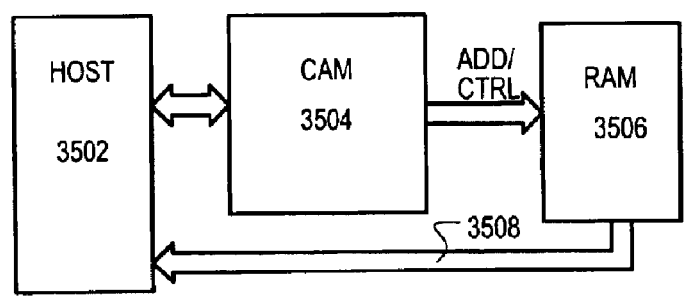
FIG. 35 is a block diagram of a second conventional search engine system.

Referring now to FIG. 30, a memory device is set forth in a block diagram to illustrate how various operations according to the present invention may be executed.

FIG. 30 shows a memory device 3000 that may include an array portion 3002, a row decoder 3004, and a column decoder 3006. In one very particular approach an array portion 3002 may be a random access memory (RAM) that includes static and/or dynamic RAM cells, preferably static RAM cells. A row decoder 3004 may activate a row in response to a row address. Similarly, a column decoder 3006 may select one or more columns of memory cells in response to a column address. In the particular example, the memory device 3000 can provide "x64" access. Thus, a column address may select 64 columns.

A memory device 3000 may also include an address generator 3008 that may receive a portion of an address ADDRESS, a size value SIZE, and a mode value MODE. An address portion may be received in a request, like the address field ADDRESS shown in FIG. 12. More particularly, an address value may be a "word" address value for accessing 64 bit words, in this specific example. Similarly, a size value may be determined from a command, such as bits "eee" of FIG. 14. A mode value MODE can be determined by a command decoder 3010, which may receive a command value, like those of column CMD in FIGS. 14 and/or 27.

An address generator 3008 may access consecutive words according to a size value SIZE, when a mode value MODE indicates a range type operation. Further, in a very particular embodiment, an address generator 3008 may activate a first word indicator FIRST WORD, when a first word of multiple words is accessed, and may activate a last word indicator LAST WORD, when a first word of multiple words is accessed.

A memory device 3000 may also include a data path enable section 3012. A data path enable section 3012 may selectively enable one or more data paths that provide access to an array 3002. In the particular example shown, a data path enable section 3012 can commonly amplify or not amplify data bytes (e.g., 8-bits) according to an enable signal. In this way, selected data bytes may be selectively included or excluded from various operations. For example, if an enable signal EN0 is inactive and enable signals EN1 to EN7 are active in a read operation, a first byte may not be read from a device, and output data corresponding to such a first data byte may be set to a predetermined value. Similarly, if enable signals (EN0 to EN7) have the same example values in a write operation, write data for a first byte may not be written, while write data for all other bytes can be written.

Of course, while the example of a FIG. 30 shows selective byte access by operation of amplifiers in a data path enable section 3012, a same function could be accomplished with selective enabling of passgates, or the like, as but one of the many possible implementations.

Enable signals (EN0 to EN7) can be generated by an amplifier decoder 3014. An amplifier decoder 3014 may receive a mode value MODE, a first word indicator FIRST WORD, a last word indicator LAST WORD, and a portion of an address ADD. A first word indicator FIRST WORD can indicate a first word accessed in a range type operation (e.g., ReadRange, WriteRange, etc.). Similarly, a last word indicator LAST WORD can indicate a last word accessed in a range type operation. A portion of an address ADD can be byte least significant bits (LSBs). That is, such an address portion ADD may indicate a particular byte for an operation. Even more particularly, assuming 64-bit access for a memory device 3000, a portion ADD can be a three-bit value for indicating one of eight bytes in such a 64-bit word.

A command decoder 3010 may receive command data and generate a mode value MODE and operation value OP.

The particular example of FIG. 30 also includes an output data latch 3016. An output data latch 3016 may store output data from a data path enable section 3012. An output data latch 3016 may have an input connected to a data path enable section 3012 and an output connected to both one input of an arithmetic logic unit (ALU) 3018 and to output data lines 3020.

An ALU 3018 may perform a predetermined operation according to an operation value OP. Such operations may include, without limitation, logical AND-type functions, logical OR-type functions, addition, increment, decrement, and an insert function. An insert function may include outputting first input data if such input data is not zero or outputting second input data if first input data is zero. Addition operations may preferably be limited along indicated byte boundaries.

An ALU 3018 may have one input connected to output data latch 3016 and another input connected to an input data latch 3022. An output of ALU 3018 may be connected to data path enable section 3012.

A memory device 3000 may also include a multiplexer (MUX) 3024, a byte shift circuit 3026, and a shift decoder 3028. A MUX 3024 may have one input connected to a first portion of data lines (e.g., bits 0–31) and another input connected to a second portion of data liens (e.g., bits 32–63). A MUX 3024 may have an output connected to a second portion of the inputs (e.g., bits 32–63) to input data latch 3022. In one very particular example, if a mode value MODE indicates an Add4 Byte operation, a lower four bytes may be provided as higher four bytes.

A byte shift circuit 3026 may be a circular shifter that can shift input data, on a byte-by-byte basis, according to a mode value MODE and received byte address ADD. Such a shift operation can accommodate input data formats like those shown in FIG. 19. A shift decoder 3028 can generate shift control signals that indicate by how many bytes input data may be shifted.

FIG. 30 may also accommodate bit related operations, like those described with reference to FIGS. 27 to 29. In the example shown, a bit operation decoder 3030 may generate a data value that can be supplied to an ALU 3018 to arrive at a given bit operation. A bit operation decoder 3030 can receive a mode value MODE and a bit location value "ggg". In the very particular example of FIG. 30, a bit operation decoder 3030 may generate a byte value in response to such inputs.

One very particular operation of an amplifier decoder 3014 is shown in FIGS. 31A to 31E. FIG. 31A shows how selective byte access may be determined for a first word in a range operation and/or for an Add8 Byte operation. As shown, a data byte for an addressed location may be enabled (shown as "I") along with all data bytes of higher significance. Such an operation may provide for results like those shown in FIGS. 15A to 20, which can access a first word with an address that does not fall along a word boundary.

FIG. 31B shows how selective byte access may be determined for a last word in a range operation. As shown, a last data byte of an indicated range may be enabled (shown as "1"), along with all data bytes of lower significance. Such an operation can also provide for results like those shown in FIGS. 15A to 20, which can access a last word according to an address and range size value, where such an address does not fall along a word boundary.

FIG. 31C shows how selective byte access may be determined for an intermediate word in a range operation (i.e., neither a first word or last word). As shown, all data bytes for such a word can be enabled, regardless the byte address of a start address.

FIG. 31D shows how selective byte access may be determined for an Add2 Byte operation, or the like, that can access data along two byte boundaries. As shown, depending upon a given byte address (ADD), either both or a more significant of two bytes can be enabled. Such an operation can provide for results like those shown in FIGS. 22A and 22B.

FIG. 31E shows how selective byte access may be determined for an Add4 Byte operation, or the like, that can access data along four byte boundaries. As shown, depending upon a given byte address (ADD) more significant bytes of a four byte range can be enabled.

One very particular example of a shift decoder 3028 is shown by FIGS. 32A and 32B. FIG. 32A shows how in a non-range mode, a shift decoder 3028 may generate byte shift amounts according to a received address. FIG. 32B shows how in a range mode, shifting may not take place. Such an operation may accommodate input data formats like those shown in FIG. 26.

One very particular example of a bit operation decoder 3030 is shown in FIG. 33A. As shown, when a mode value MODE indicates a SetBit operation, a bit operation decoder 3030 may generate byte values having one particular bit that is "1" while all other bits are zero. The particular bit can be determined according to a bit location value "ggg". As also shown in FIG. 33A, it is understood that in response to the same SetBit operation, an ALU operation value (OP) can force an ALU (e.g., 3018 of FIG. 30) to perform a logical OR operation.

Another particular example of a bit operation decoder 3030 is shown in FIG. 33B. When a mode value MODE indicates a ClearBit operation, a bit operation decoder 3028 may generate byte values having one particular bit that is "0" while all other bits are ones. The particular bit can be determined according to a bit location value "ggg". As also shown in FIG. 33B, it is understood that in response to the same SetBit operation, an ALU operation value (OP) can force an ALU (e.g., 3018 of FIG. 30) to perform a logical AND operation.

Of course, FIG. 30 shows but one very particular way in which a memory device may perform various operations described, and should not be construed as limiting the invention thereto.

Thus, it is understood that while the embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
   at least one output port for providing the command data received by at least one input port and for providing result data generated in response to the command data; and
   a memory core that executes indivisible operations in response to predetermined commands, the indivisible operations including writing data to a memory location generated by modifying data read from the memory location.

2. The semiconductor device of claim 1, wherein:
   the output port is a point-to-point connection.

3. The semiconductor device of claim 1, wherein:
   the command data is no more than 8 bits.

4. The semiconductor device of claim 1, including:
   a first vote portion that generates an output result value from at least two input result values, the first vote portion having a first input coupled to the memory core and a second input coupled to the at least one output port.

5. The semiconductor device of claim 4, further including:
   a second vote portion that generates an output result value from at least two input result values, the second vote portion having a first input coupled to a first input port and a second input coupled to a second input port, and an output coupled to the memory core and an input of the first vote portion.

6. The semiconductor device of claim 1, wherein:
   the semiconductor device includes at least two output ports, each output port providing the command data received by at least one input port and the result data generated in response to the command data.

7. The semiconductor device of claim 1, wherein:
   the memory core accesses data values of M*N bits and includes
   M data paths, each including N data bits, and
   a decoder circuit that selectively enables different numbers of data paths according to lower significance bits of an address.

8. The semiconductor device of claim 1, wherein:
   the memory core includes M data paths, each including N data bits, and
   an arithmetic logic unit coupled to the data paths that executes predetermined operations in response to the command data, the predetermined operations being selected from the group consisting of: adding a predetermined value to a data value and in the memory core, logically ORing a predetermined value to a data value stored in the memory core, logically ANDing a predetermined value to a data value stored in the memory core, incrementing a data value stored in the memory core, decrementing a data value stored in the memory core, and outputting a received data value if a data value stored in the memory core has a predetermined value.

* * * * *